US012593468B2

(12) United States Patent
Xie et al.

(10) Patent No.: US 12,593,468 B2
(45) Date of Patent: Mar. 31, 2026

(54) SELF-ALIGNED BACKSIDE CONTACT WITH INCREASED CONTACT AREA

(71) Applicant: INTERNATIONAL BUSINESS MACHINES CORPORATION, Armonk, NY (US)

(72) Inventors: Ruilong Xie, Niskayuna, NY (US); Kisik Choi, Watervliet, NY (US); Junli Wang, Slingerlands, NY (US); Somnath Ghosh, Clifton Park, NY (US); Julien Frougier, Albany, NY (US); Min Gyu Sung, Latham, NY (US); Theodorus E. Standaert, Clifton Park, NY (US); Nicolas Jean Loubet, Guilderland, NY (US); Huiming Bu, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 890 days.

(21) Appl. No.: 17/664,662

(22) Filed: May 24, 2022

(65) Prior Publication Data

US 2023/0411466 A1      Dec. 21, 2023

(51) Int. Cl.
| | |
|---|---|
| *H10D 30/67* | (2025.01) |
| *H10D 30/01* | (2025.01) |
| *H10D 64/01* | (2025.01) |

(52) U.S. Cl.
CPC ....... *H10D 30/6729* (2025.01); *H10D 30/031* (2025.01); *H10D 64/01* (2025.01); (Continued)

(58) Field of Classification Search
CPC .......... H10D 30/6735; H10D 84/0149; H10D 84/013; H10D 30/6219; H10D 30/62; (Continued)

(56) References Cited

U.S. PATENT DOCUMENTS

| | | |
|---|---|---|
| 9,570,395 B1 | 2/2017 | Sengupta |
| 10,586,765 B2 | 3/2020 | Smith |

(Continued)

FOREIGN PATENT DOCUMENTS

| | | |
|---|---|---|
| CN | 119234319 A | 12/2024 |
| CN | 119318217 A | 1/2025 |

(Continued)

OTHER PUBLICATIONS

Intellectual Property Office, "Request for the Submission of an Opinion," Apr. 14, 2025, 10 Pages, KR Application No. 10-2024-7031097.

(Continued)

*Primary Examiner* — Julio J Maldonado
*Assistant Examiner* — Kenneth S. Stephenson
(74) *Attorney, Agent, or Firm* — L. Jeffrey Kelly

(57)      ABSTRACT

A first source drain region adjacent to a first transistor, a second source drain region adjacent to a second transistor, an upper source drain contact above the first source drain region, a bottom source drain contact below the second source drain region, the bottom and the upper source drain contacts are on opposite sides, a horizontal surface of the bottom source drain contact is adjacent to a horizontal surface of dielectric side spacers surrounding the second source drain region. An embodiment where a bottom source drain contact surrounds vertical sides of a source drain region. A method including forming a first and a second nanosheet stacks, forming a top source drain contact to a first source drain region adjacent to the first nanosheet stack, forming a bottom source drain contact to a lower horizontal surface of a second source drain region adjacent to the second nanosheet stack.

20 Claims, 43 Drawing Sheets

(52) U.S. Cl.
    CPC ..... *H10D 30/6735* (2025.01); *H10D 30/6757*
            (2025.01); *H10D 30/6758* (2025.01)

(58) Field of Classification Search
    CPC ............. H10D 84/0186; H10D 84/017; H10D
            30/6757; H10D 62/121; H10D 30/0198;
            H10D 64/254; H10D 30/6729; H10D
            64/251; H10D 30/6713; H10D 30/00;
            H10D 30/501; H10D 30/60; H10D 30/67;
            H10D 64/647; H10D 64/256; H10D
            30/6717; H01L 23/5286; H01L 21/76897;
            H10W 20/427; H10W 20/069; H10W
            20/0693; H10W 20/0696
    See application file for complete search history.

(56) References Cited

U.S. PATENT DOCUMENTS

| | | | |
|---|---|---|---|
| 10,636,739 | B2 | 4/2020 | Beyne |
| 10,700,207 | B2 | 6/2020 | Chen |
| 10,797,139 | B2 | 10/2020 | Morrow |
| 11,195,930 | B1 | 12/2021 | Chen et al. |
| 2019/0214502 | A1 | 7/2019 | Xu et al. |
| 2020/0105671 | A1 | 4/2020 | Lai |
| 2021/0134721 | A1 | 5/2021 | Chiang |
| 2021/0202385 | A1 | 7/2021 | Huang |
| 2021/0305252 | A1 | 9/2021 | Chiang |
| 2021/0305381 | A1 | 9/2021 | Chiang |
| 2021/0305408 | A1 | 9/2021 | Yu et al. |
| 2021/0351303 | A1 | 11/2021 | Ju |
| 2021/0376071 | A1 | 12/2021 | Liu |
| 2021/0376093 | A1 | 12/2021 | Chu |
| 2021/0399099 | A1 | 12/2021 | Chu et al. |
| 2022/0028786 | A1 | 1/2022 | Huang |
| 2022/0069117 | A1 | 3/2022 | Yu et al. |
| 2022/0157956 | A1 | 5/2022 | Chen |
| 2022/0310804 | A1 * | 9/2022 | Su ..................... H01L 21/76897 |
| 2023/0197815 | A1 * | 6/2023 | Huang ................... H10D 84/83 |
| | | | 257/288 |

| | | | |
|---|---|---|---|
| 2023/0290825 | A1 * | 9/2023 | Guler ................. H10D 30/6757 |
| 2023/0378190 | A1 * | 11/2023 | Liaw .................... H10D 84/038 |
| 2023/0411289 | A1 | 12/2023 | Xie et al. |

FOREIGN PATENT DOCUMENTS

| | | |
|---|---|---|
| EP | 4533546 A | 4/2025 |
| EP | 4533547 A1 | 4/2025 |
| KR | 10-2024-0154064 A | 10/2024 |
| KR | 10-2024-0157041 A | 10/2024 |
| TW | 202129971 A | 8/2021 |
| TW | 202201554 A | 1/2022 |
| TW | 202205460 A | 2/2022 |
| TW | 202209568 A | 3/2022 |
| TW | 1821132 B | 12/2023 |
| TW | 1849780 B | 12/2023 |
| WO | 2023/227271 A1 | 11/2023 |
| WO | 2023/227321 A1 | 11/2023 |

OTHER PUBLICATIONS

IBM: List of IBM Patents or Patent Applications Treated as Related (Appendix P), Jun. 3, 2022, 2 pages.

Pending U.S. Appl. No. 17/664,663, filed May 24, 2022, entitled: "Self-Aligned Backside Contact With Increased Contact Area", 87 pages.

Notification of Transmittal of the International Search Report and the Written Opinion of the International Searching Authority, or the Declaration, Date of mailing, Jun. 9, 2023, International application No. PCT/EP2023/056450, 9 pages.

Mathur et al., "Buried Bitline for sub-5nm SRAM Design", Published in: 2020 IEEE International Electron Devices Meeting (IEDM), 7 pages.

Prasad et al., "Buried Power Rails and Back-side Power Grids: Arm® CPU Power Delivery Network Design Beyond 5nm", IEDM19-446, © 2019 IEEE, p. 19.1.1-19.1.4.

Intellectual Property Office, "Request for the Submission of an Opinion," Jun. 12, 2025, 13 Pages, KR Application No. 10-2024-7032354.

* cited by examiner

100

Section X-X

Section Y-Y

Section X-X

100

X 107
108
104
102

X

Section Y-Y

Section X-X

Section Y-Y

100

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

Section X-X

Section Y-Y

SELF-ALIGNED BACKSIDE CONTACT WITH INCREASED CONTACT AREA

BACKGROUND

The present invention relates, generally, to the field of semiconductor manufacturing, and more particularly to a backside contact.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet device contains one or more layers of semiconductor channel material portions having a vertical thickness that is substantially less than its width. A nanosheet FET includes a plurality of stacked nanosheets extending between a pair of source/drain epitaxial regions. The device may be a gate all around device or transistor in which a gate surrounds a portion of the nanosheet channel.

SUMMARY

According to an embodiment, a semiconductor device is provided. The semiconductor device including a first source drain region adjacent to a first transistor on a substrate, a second source drain region adjacent to a second transistor on the substrate, an upper source drain contact vertically aligned above and electrically connected to the first source drain region, and a bottom source drain contact vertically aligned below and electrically connected to the second source drain region, where the bottom source drain contact and the upper source drain contact are on opposite sides of the semiconductor device, where a horizontal surface of the bottom source drain contact is adjacent to a horizontal surface of dielectric side spacers surrounding the second source drain region, where a width of the bottom source drain contact is wider than a width of the second source drain.

According to an embodiment, a semiconductor device is provided. The semiconductor device including a first source drain region a bottom source drain contact vertically aligned below and electrically connected to the first source drain region, where the bottom source drain contact surrounds vertical sides of the second source drain region.

According to an embodiment, a method is provided. The method including forming a forming a first nanosheet stack and a second nanosheet stack on a substrate, forming a top source drain contact to an upper horizontal surface of a first source drain region adjacent to the first nanosheet stack, bonding a carrier wafer to an upper surface of the substrate above the first nanosheet stack and the second nanosheet stack and forming a bottom source drain contact to a lower horizontal surface of a second source drain region adjacent to the second nanosheet stack, the bottom source drain contact and the second source drain region are vertically aligned, where the bottom source drain contact surrounds vertical sides of the second source drain region.

BRIEF DESCRIPTION OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. In the drawings.

Figure 1:
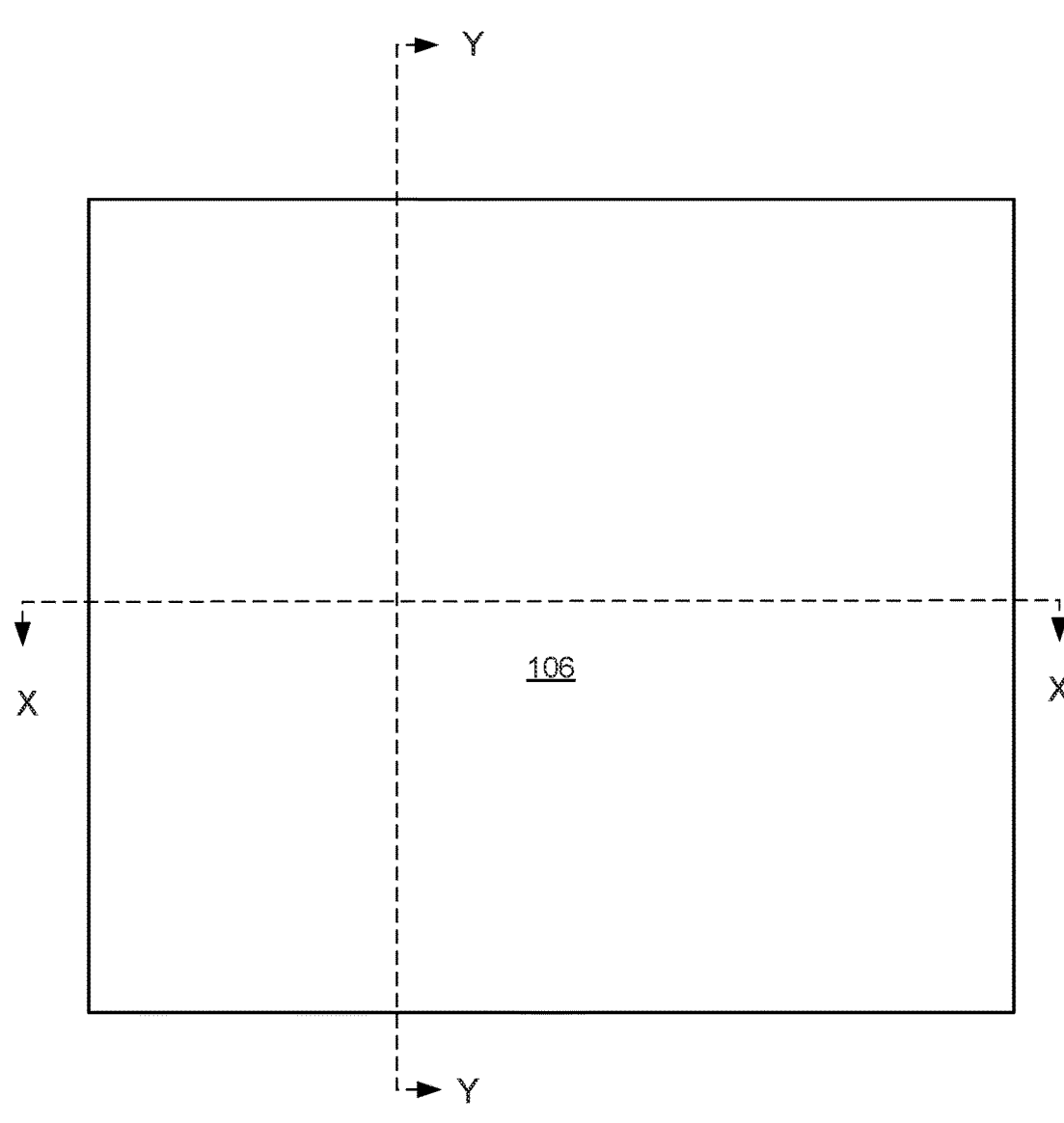
FIG. 1 illustrates a top view of a semiconductor structure at an intermediate stage of fabrication, according to an exemplary embodiment.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numbers may be repeated among the figures to indicate corresponding or analogous features.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

A nanosheet field effect transistor (hereinafter "FET") may be formed from alternating layers of silicon and silicon germanium, which are then formed into stacked nanosheets. A gate all around structure may be formed on all vertical sides and on a horizontal top surface of a section of the nanosheets. Source-drain structures may be formed at the opposite ends of the stacked nanosheet structures.

Forming the nanosheet FET may have the following steps. Layers of the stacked nanosheet are formed on a substrate, trenches are formed parallel to each other in the layers of the stacked nanosheet to form fins and sacrificial gates are then formed perpendicular to the trenches. Additional trenches are formed between sacrificial gates, perpendicular to the original trenches. In an embodiment of the present invention, the trench may be extended into the substrate and a sacrificial layer formed in a portion of the trench in the substrate. This trench may be formed where a backside contact to a source drain may be subsequently formed. Outer portions of sacrificial layers of the stacked nanosheets may be removed and inner spacers formed where the outer portions of the sacrificial layers of the stacked nanosheets where removed. Source drain regions are formed extending out from exposed channel layers of the nanosheet stacks. A source drain region may be formed over the trench. The sacrificial gates are removed, and remaining portions of the sacrificial layers are removed. A metal gate may be formed where the sacrificial gates and the remaining portions of the sacrificial layers were removed, surrounding the channel layers. Contacts may be formed to the metal gate and to the source drain, specifically to the source drain areas which do not have a sacrificial layer under the source drain. Further formation of back end of line (BEOL) layers of wiring and vias may be done.

An embodiment of forming a backside contact may include bonding a carrier substrate to an upper surface of the formed nanosheet FET with BEOL layers, above the BEOL layers, turning the structure upside down and then forming a backside opening above the sacrificial layer and removing the sacrificial layer. A self-aligned sacrificial backside contact in the backside opening may be formed to the source drain. Additional layers of lines and vias may be formed above the backside contact and may connect to the backside contact.

An embodiment of forming a backside contact may include using a different material for a dielectric spacer vertically surrounding the source drain from a material of a bottom dielectric isolation below the nanosheet stack. When forming a backside opening, portions of the dielectric spacer may be selectively removed, and the self-aligned sacrificial backside contact may be formed surrounding a portion of a vertical side surface of the source drain, as well as covering a bottom surface of the source drain.

There are several advantages to formation of self-aligned sacrificial backside contact, including flexibility to form source drain contacts from either above the structure or below the structure, and forming contacts with greater spacing as less contacts may be needed overall above the nanosheet device. Having a self-aligned contact is an additional advantage due to relative backside lithography alignment accuracy compared to frontside lithography, which is due to wafer distortion or non-uniformity in thickness. The self-aligned contact is formed by forming the sacrificial backside contact placeholder under the source drain epitaxy such that the location of the backside contact is pre-defined, and formation no longer relies on the overlay performance of backside lithography process.

The present invention relates, generally, to the field of semiconductor manufacturing, and more particularly a backside contact.

Embodiments of the present invention disclose a structure and a method of forming a FET nanosheet with a self-aligned backside contact are described in detail below by referring to the accompanying drawings in FIGS. 1-43, in accordance with an illustrative embodiment.

Figure 2:
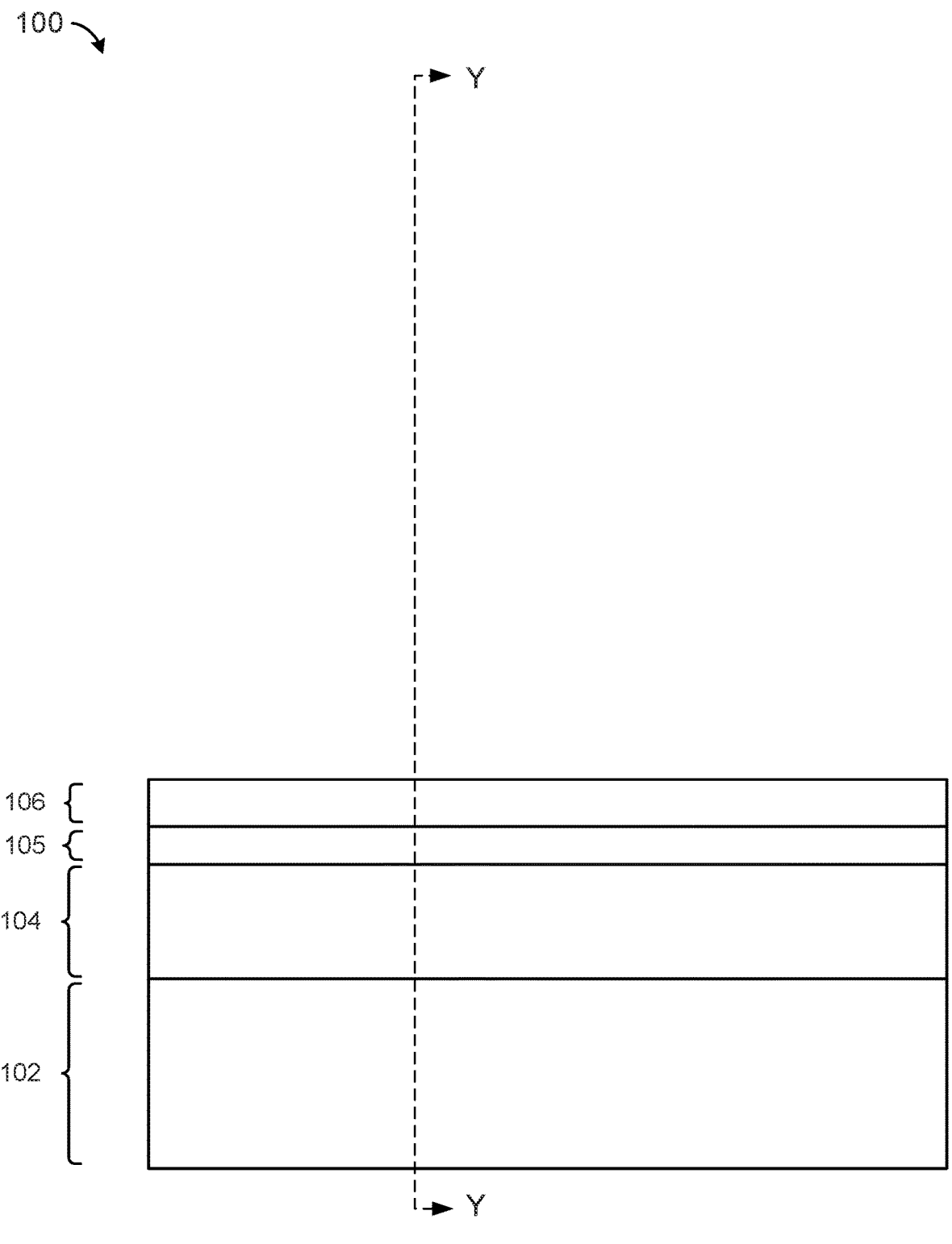
FIGS. 2 and 3 each illustrate a cross-sectional view of the semiconductor structure of FIG. 1 along section line X-X and Y-Y, respectively, according to an exemplary embodiment.
Figure 3:
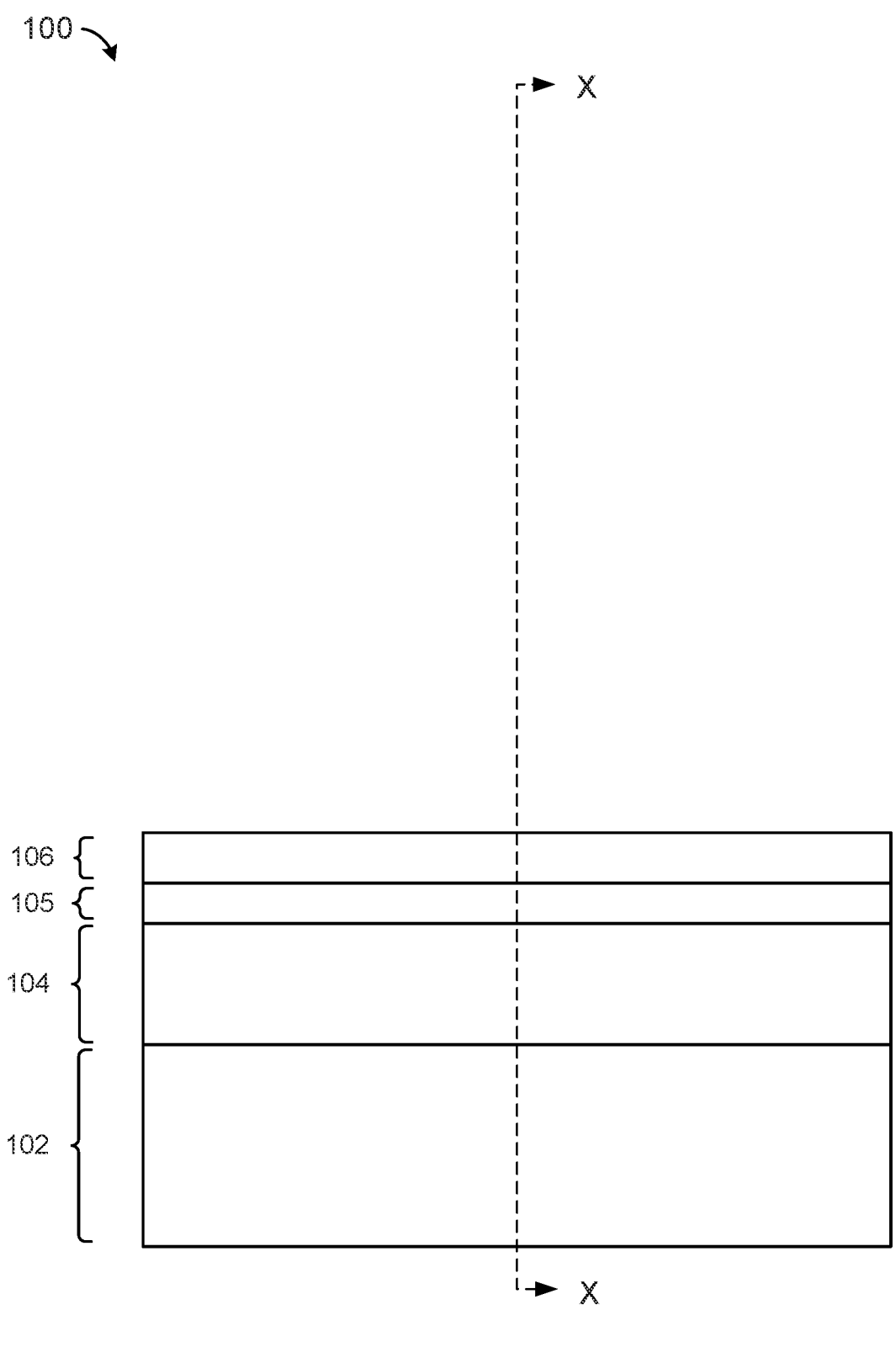

Referring now to FIGS. 1, 2 and 3, a semiconductor structure 100 (hereinafter "structure") at an intermediate stage of fabrication is shown according to an exemplary embodiment. FIG. 1 is a top view of the structure 100. FIG. 2 is a cross-sectional view of the structure 100 along section line X-X. FIG. 3 is a cross-sectional view of the structure 100 along section line Y-Y and is perpendicular to section line X-X. The structure 100 of FIG. 1 may be formed or provided. The structure 100 may include a substrate and a silicon germanium layer 106.

The substrate may be a silicon-on-insulator ("SOI) substrate which includes a silicon substrate 102, a buried oxide layer 104 (hereinafter "BOX SiO2") on the silicon substrate 102, and a thin silicon layer 105 on the BOX SiO2 104. In other embodiments, the substrate may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium arsenide. Typically, the substrate may be approximately, but is not limited to, several hundred microns thick.

Figure 4:
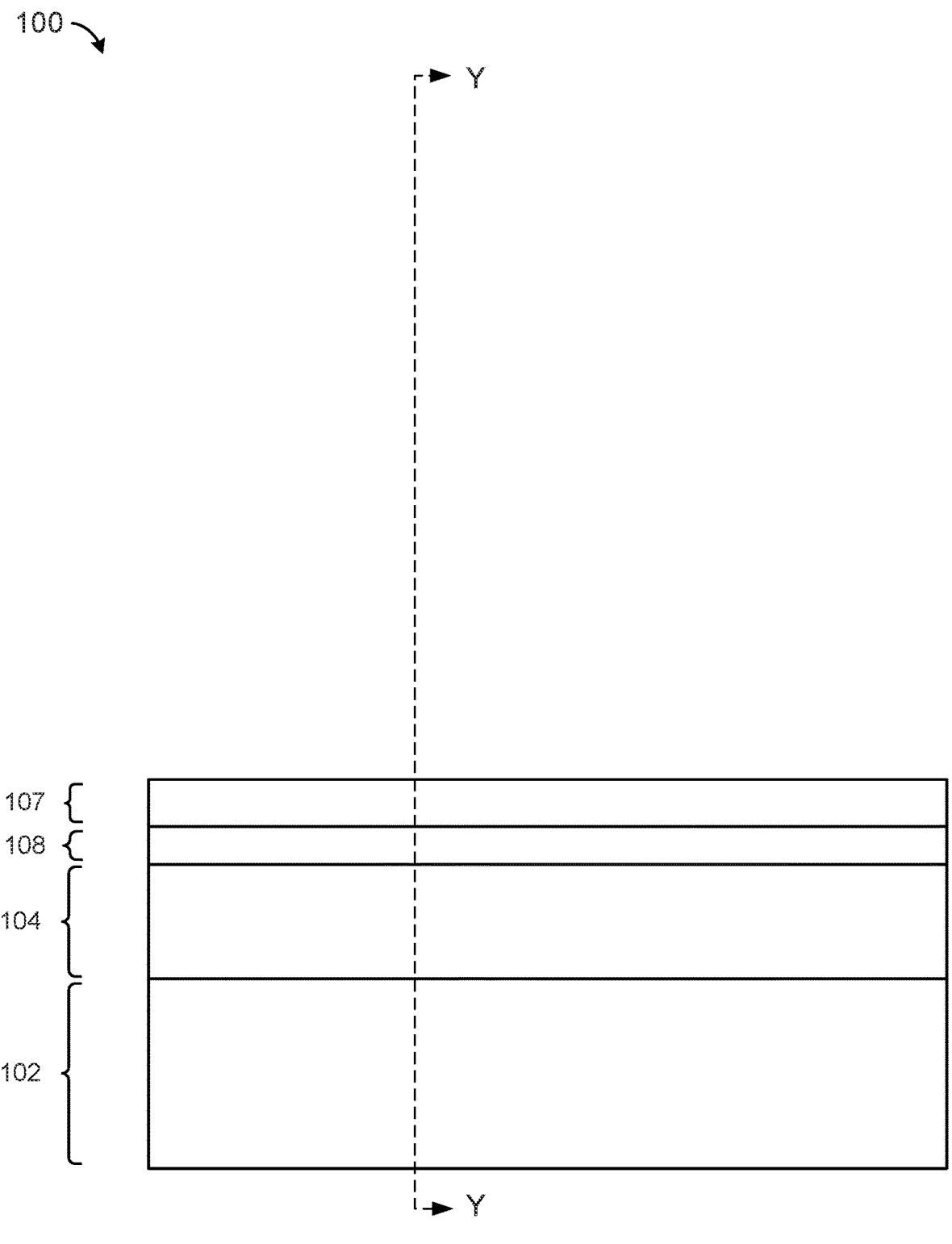
FIGS. 4 and 5 each illustrate a cross-sectional view of the semiconductor structure along section line X-X and Y-Y, respectively, and illustrates formation of a stack sacrificial layer, according to exemplary embodiment.
Figure 5:
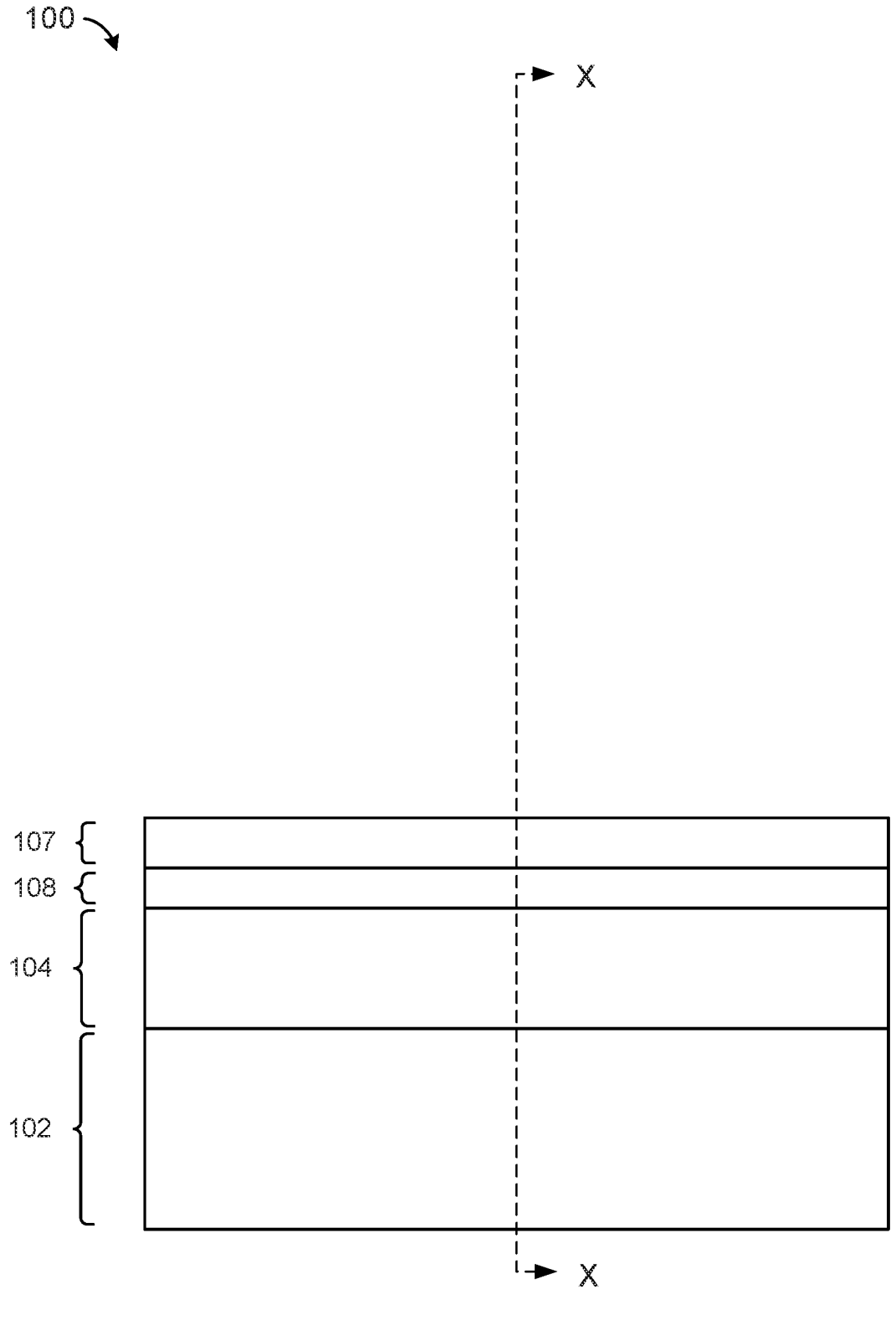

Referring now to FIGS. 4 and 5, the structure 100 is shown according to an exemplary embodiment. FIGS. 4 and 5 are each a cross-sectional view of the structure 100 along section lines X-X and Y-Y, respectively. FIGS. 4 and 5 are perpendicular to each other. A stack sacrificial layer 108 and a silicon oxide layer 107 is formed from the silicon germanium layer 106 and the thin silicon layer 105.

The silicon germanium layer 106 may be epitaxially grown and conformally cover an upper surface of the thin silicon layer 105 on the structure 100. The silicon germanium layer 106, may, for example, be silicon germanium with a germanium concentration about 35 atomic percent to 85 atomic percent, although percentages greater than 85 percent and less than 35 percent may be used.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition technique, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed.

Examples of various epitaxial growth techniques include, for example, rapid thermal chemical vapor deposition (RT-CVD), low-energy plasma deposition (LEPD), ultra-high vacuum chemical vapor deposition (UHVCVD), low pressure chemical vapor deposition (LPCVD), atmospheric pressure chemical vapor deposition (APCVD) and molecular beam epitaxy (MBE). The temperature for epitaxial deposition typically ranges from approximately 550° C. to approximately 900° C. Although higher temperature typically results in faster deposition, the faster deposition may result in crystal defects and film cracking.

The structure 100 may be subject to a thermal oxidation process. This results in diffusion of germanium from the silicon germanium layer 106 with the thin silicon layer 105 to form the stack sacrificial layer 108 and the silicon oxide layer 107.

The stack sacrificial layer 108, may, for example, be silicon germanium with a germanium concentration about 55 atomic percent, although percentages greater than 55 percent and less than 55 percent may be used. The stack sacrificial layer 108 will subsequently be removed selective to the remaining alternating layers, as described below. The thin silicon layer 105 of the substrate may be converted to the stack sacrificial layer 108 by growing the silicon germanium layer 106 followed by a silicon germanium condensation process.

Figure 6:
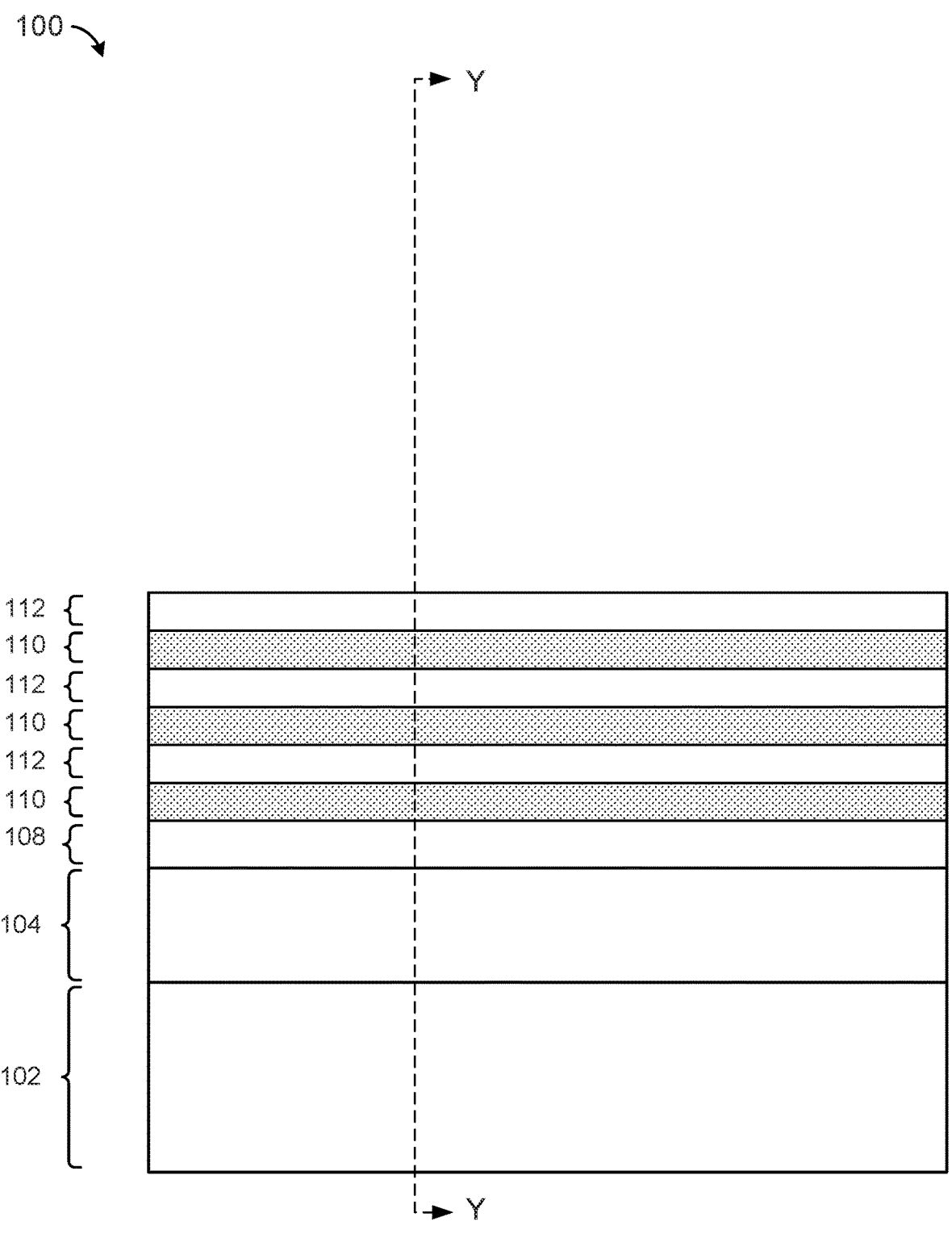
FIGS. 6 and 7 each illustrate a cross-sectional view of the semiconductor structure along section line X-X and Y-Y, respectively, and illustrates formation of sacrificial layers and semiconductor layers, according to an exemplary embodiment.
Figure 7:
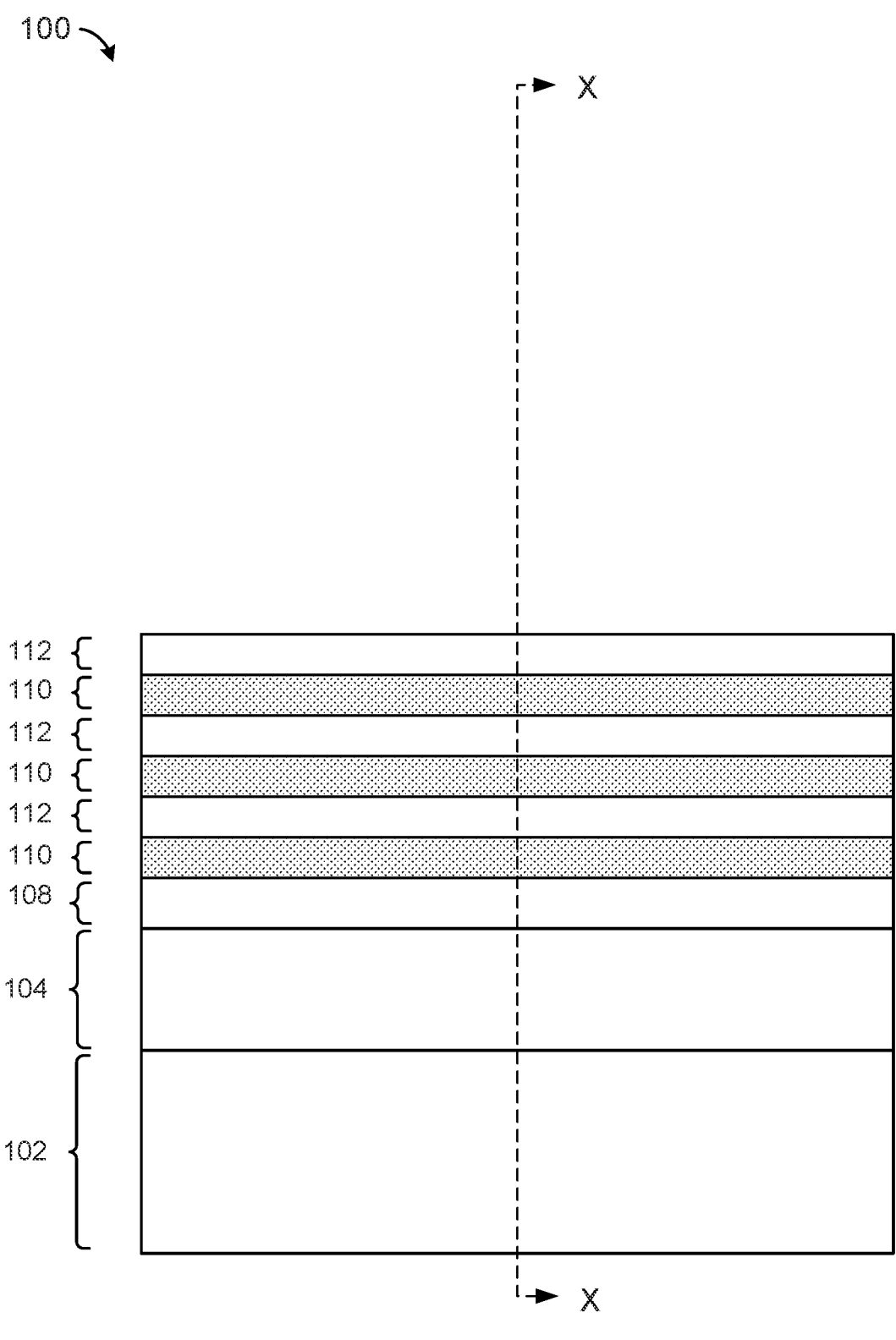

Referring now to FIGS. 6 and 7, the structure 100 is shown according to an exemplary embodiment. FIGS. 6 and 7 are each a cross-sectional view of the structure 100 along section lines X-X and Y-Y, respectively. FIGS. 6 and 7 are perpendicular to each other. The silicon oxide layer 107 may be removed. A stacked nanosheet may be formed on the structure 100.

The silicon oxide layer 107 may be removed by methods known in the arts, exposing an upper surface of the stack sacrificial layer 108.

Alternating layers of sacrificial semiconductor material and semiconductor channel material may collectively be referred to as a stacked nanosheet.

The alternating layers of sacrificial semiconductor material and semiconductor channel material may include a sacrificial semiconductor material layer 110 (hereinafter "sacrificial layer"), covered by a semiconductor channel material layer 112 (hereinafter "channel layer"), covered by a sacrificial layer 110, covered by a channel layer 112, covered by a sacrificial layer 110, covered by a channel layer 112.

The alternating layers of sacrificial layer 110 and channel layer 112 can be formed by sequential epitaxial growth of alternating layers of a first semiconductor material, and a second semiconductor material stacked one on top of another on a substrate. It should be noted that, while a limited number of alternating layers are depicted, any number of alternating layers may be formed. The epitaxial growth of the first and second semiconductor materials that provide the sacrificial semiconductor material layers and the semiconductor channel material layers, respectively, can be performed utilizing any well-known precursor gas or gas mixture. Carrier gases like hydrogen, nitrogen, helium and argon can be used.

Each sacrificial layer 110 is composed of a first semiconductor material which differs in composition from at least an upper portion of the BOX SiO2 104, the channel layer 112 and the stack sacrificial layer 108. In an embodiment, each sacrificial layer 110 may be a silicon-germanium semiconductor alloy and have a germanium concentration less than 50 atomic percent. In another example, each sacrificial layer 110 may have a germanium concentration ranging from about 20 atomic percent to about 40 atomic percent. Each sacrificial layer 110 can be formed using known deposition techniques or an epitaxial growth technique as described above.

Each channel layer 112 is composed of a second semiconductor material which differs in composition from at least the upper portion of the BOX SiO2 104, the sacrificial layer 110 and the stack sacrificial layer 108. Each channel layer 112 has a different etch rate than the first semiconductor material of sacrificial layer 110 and has a different etch rate than the stack sacrificial layer 108. The second semiconductor material can be, for example, silicon. The second semiconductor material, for each channel layer 112 can be formed using known deposition techniques or an epitaxial growth technique as described above.

The sacrificial layers 110 may have a thickness ranging from about 5 nm to about 15 nm, and the channel layers 112 may have a thickness ranging from about 4 nm to about 12 nm. Each sacrificial layer 110 may have a thickness that is the same as, or different from, a thickness of each channel layer 112. In an embodiment, each sacrificial layer 110 has an identical thickness. In an embodiment, each channel layer 112 has an identical thickness. The stack sacrificial layer 108 may each have a thickness ranging from about 5 nm to about 12 nm.

Figure 8:
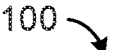
FIG. 8 illustrates a top view of a semiconductor structure and illustrates formation of a sacrificial layer gate and a gate cap, according to an exemplary embodiment.
Figure 8:
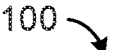
Figure 9:
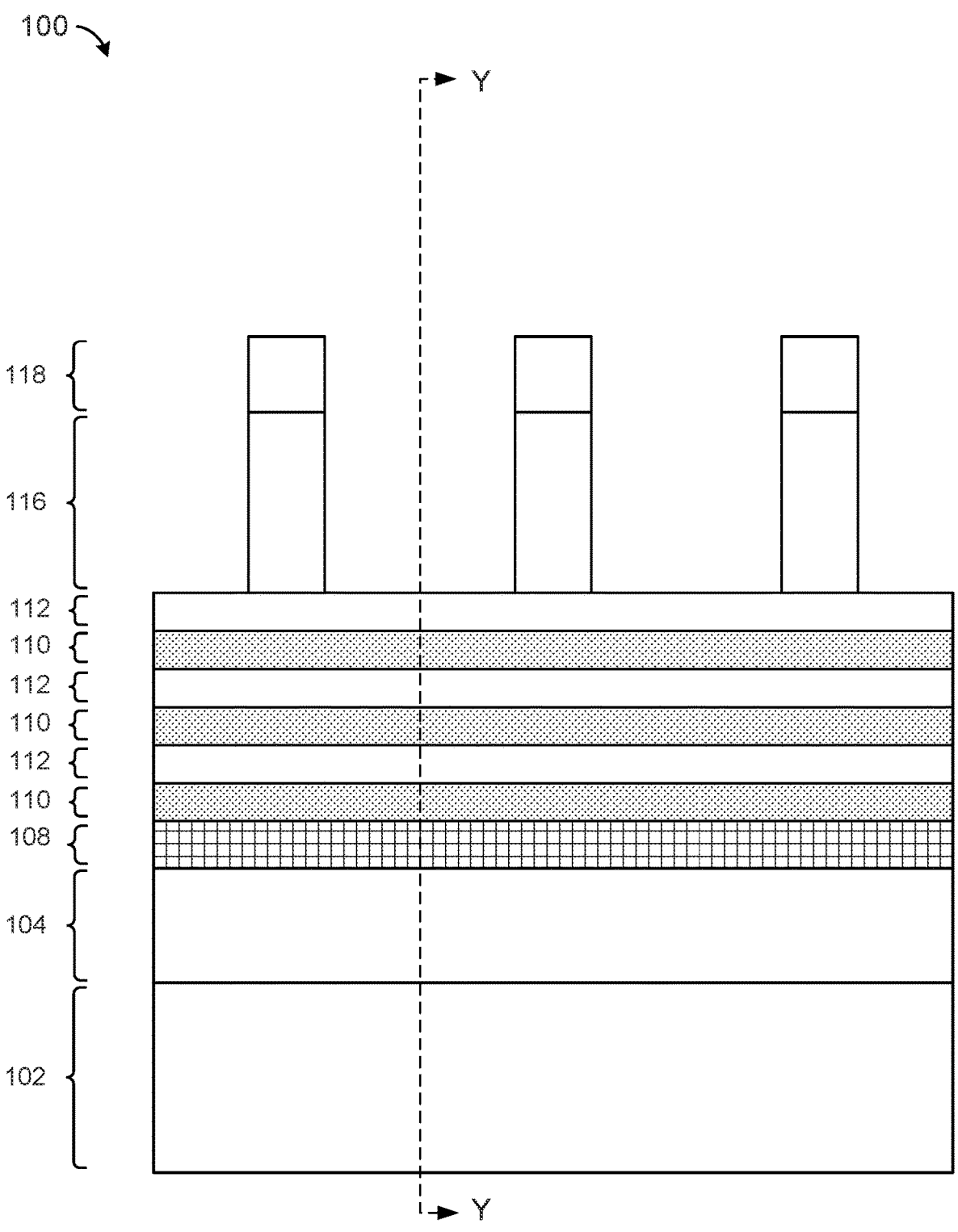
FIGS. 9 and 10 each illustrate a cross-sectional view of the semiconductor structure of FIG. 8 along section line X-X and Y-Y, respectively, according to an exemplary embodiment.
Figure 10:
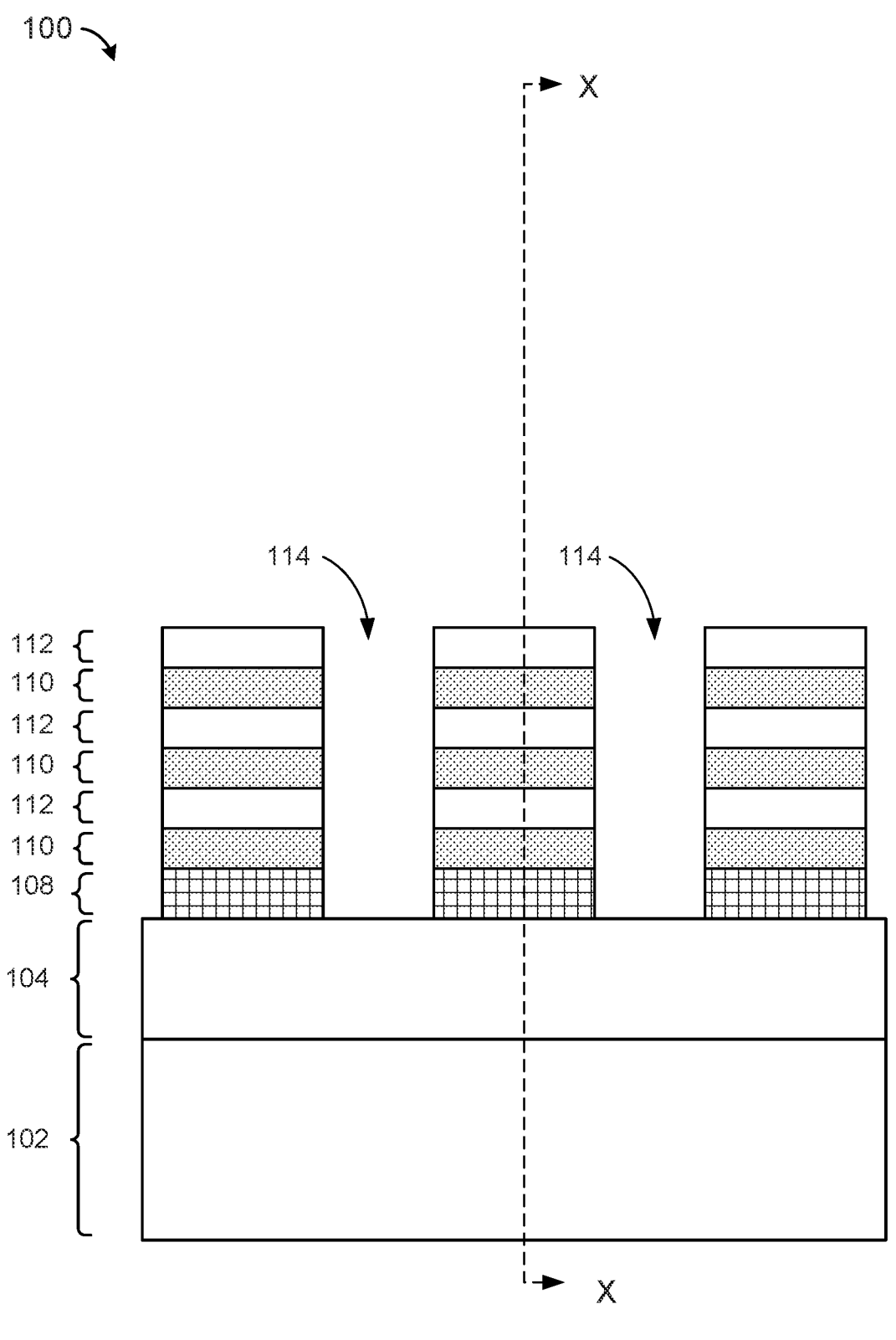

Referring now to FIGS. 8, 9 and 10, the structure 100 is shown according to an exemplary embodiment. FIG. 8 is a top view of the structure 100. FIGS. 9 and 10 are each a cross-sectional view of the structure 100 along section lines X-X and Y-Y, respectively. FIGS. 9 and 10 are perpendicular to each other.

An active device region is defined by removing unwanted portions of nanosheets to form a trench 114. A sacrificial gate 116 and a gate cap 118 may be formed. Section X-X is along fins of the nanosheet stack, parallel to adjacent trenches 114 and perpendicular to the sacrificial gate 116. Section Y-Y is between adjacent sacrificial gates 116, parallel to the sacrificial gates 116 and perpendicular to the fins of the nanosheet stack.

The stack sacrificial layer 108 and the alternating layers of sacrificial layers 110 and channel layers 112 may be formed into fins. The fins may have a length perpendicular to section line Y-Y and parallel to section line X-X. The fins may be formed by methods known in the arts, and include steps such as forming a hard mask, on the alternating layers, patterning the hard mask, and subsequent formation of one or more trenches 114, by removal of portions of each layer of the stacked nanosheet. The trench 114 may form the nanosheet stack into fins by an anisotropic etching technique, such as, for example, reactive ion etching (RIE), and stopping on etching a portion of the BOX SiO2 104 between each nanosheet stack. The BOX SiO2 104 may provide physical and electrical isolation between adjacent nanosheet stacks.

Each fin of nanosheet stack may include a stack sacrificial layer 108, covered by a sacrificial layer 110, covered by a channel layer 112, covered by a sacrificial layer 110, covered by a channel layer 112, covered by a sacrificial layer 110, covered by a channel layer 112. By way of illustration, three fins are depicted in the drawings of the present application, although any number of fins may be formed.

The material stacks that can be employed in embodiments of the present invention are not limited to the specific embodiment illustrated in FIGS. 8, 9 and 10. In FIGS. 8, 9 and 10, and only by way of an example, the nanosheet stack includes three layers of sacrificial layers 110 alternating with three channel layers 112. The nanosheet stack can include any number of sacrificial layers 110 and channel layers 112. The nanosheet stack is used to produce a gate all around device that includes vertically stacked semiconductor channel material nanosheets for a p-FET or an n-FET.

The sacrificial gate 116 and the gate cap 118 are formed orthogonal (perpendicular) to the fins. By way of illustration, three sacrificial gates 116 are depicted in the drawings of the present application, although any number of sacrificial gates 116 may be formed. The sacrificial gate 116 may include a single sacrificial material or a stack of two or more sacrificial materials. The at least one sacrificial material can be formed by forming a blanket layer (or layers) of a material (or various materials) and then patterning the material (or various materials) by lithography and an etch. The sacrificial gate 116 can include any material including, for example, polysilicon, amorphous silicon, or multilayered combinations thereof. In an embodiment where amorphous silicon is used as a material for the sacrificial gate 116, a thin layer of SiO2 is deposited first to separate the nanosheet stack from the amorphous silicon. The sacrificial gate 116 can be formed using any deposition technique including, for example, chemical vapor deposition (CVD), physical vapor deposition (PVD), high density plasma (HDP) deposition, and spin on techniques. Optionally, the gate cap 118 may be formed as part of the sacrificial gate 116 in accordance with known techniques.

In an embodiment, the sacrificial gate 116 is deposited with a thickness sufficient to fill, or substantially fill, the spaces between adjacent nanosheet structures and cover a horizontal upper surface of the uppermost channel layer 112 of the nanosheet stack. The sacrificial gate 116 may be adjacent to vertical side surfaces of the nanosheet stack or fins. The sacrificial gate 116 may cover an upper horizontal surface of the BOX SiO2 104 between adjacent nanosheet stacks. A height of the sacrificial gate 116 may be much thicker than the underlying structure and may have a height between 100 nm and 150 nm about the nanosheet stack. The gate cap 118 may cover an upper horizontal surface of the sacrificial gate 116. Gate patterning may be performed by conventional lithography and etch process, such that portions of the gate cap 118 and portions of the sacrificial gate 116 are removed from a subsequently formed source drain region.

Figure 11:
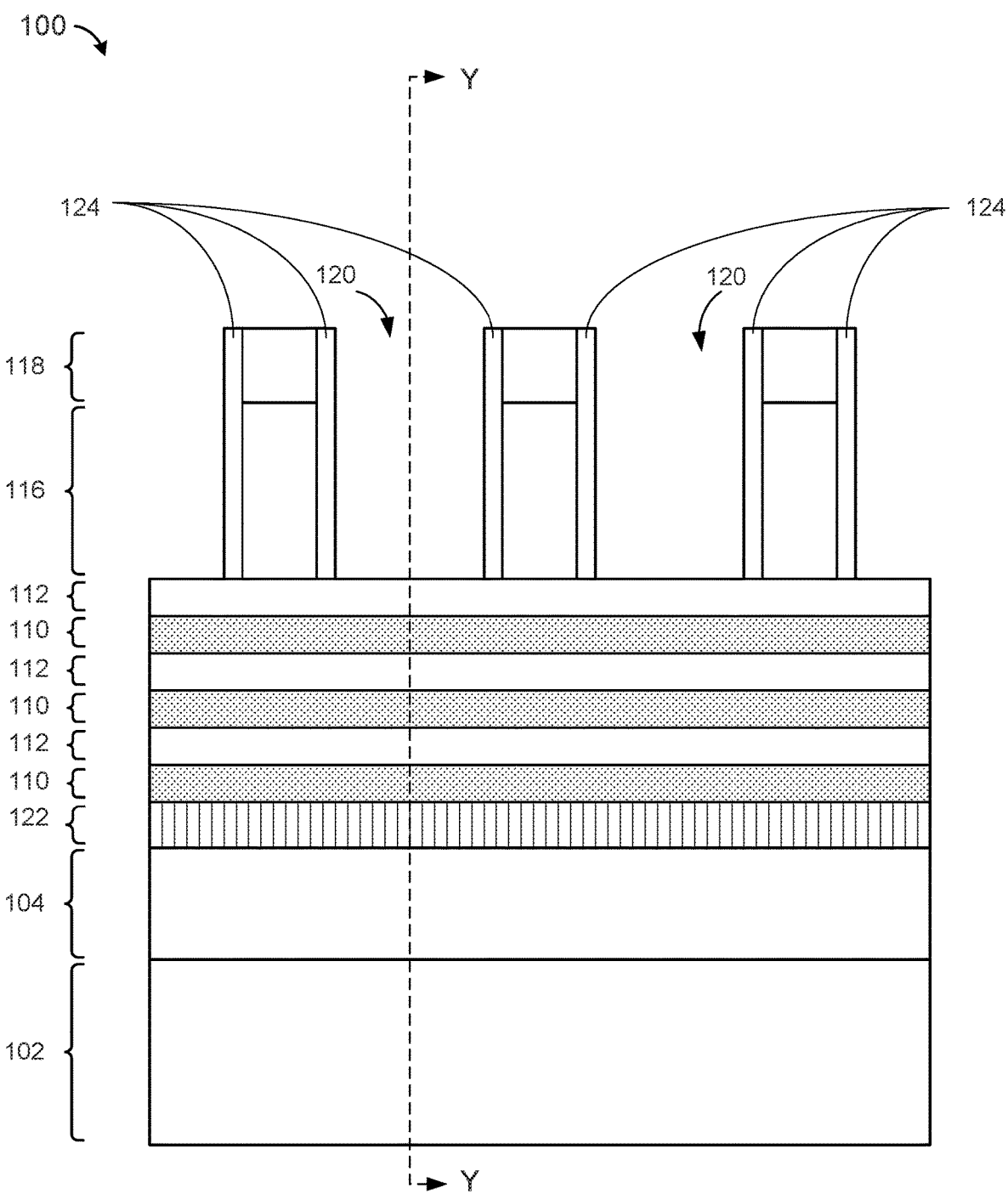
FIGS. 11 and 12 each illustrate a cross-sectional view of the semiconductor structure along section line X-X and Y-Y, respectively, and illustrate formation of a source/drain trench, according to an exemplary embodiment.
Figure 12:
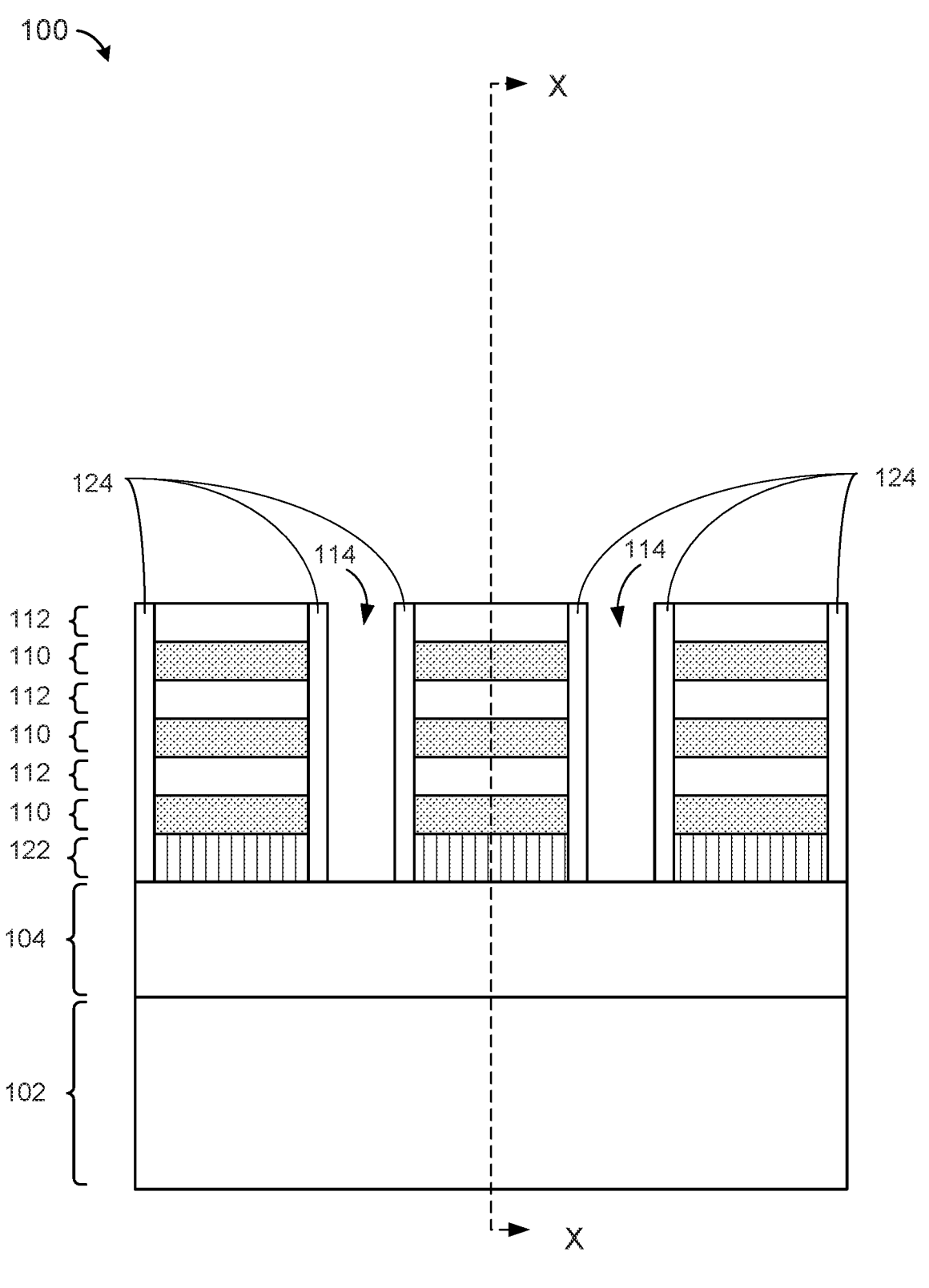

Referring now to FIGS. 11 and 12, the structure 100 is shown according to an exemplary embodiment. FIGS. 11 and 12 are each a cross-sectional view of the structure 100 along section lines X-X and Y-Y, respectively. FIGS. 11 and 12 are perpendicular to each other. The stack sacrificial layer 108 may be removed. A bottom dielectric isolation 122 (hereinafter "BDI") and a dielectric spacer 124 may be formed.

The stack sacrificial layer 108 may be selectively removed by methods known in the arts. For example, a dry etching technique can be used to selectively remove the stack sacrificial layer 108, such as, for example, using vapor phased HCl dry etch. The stack sacrificial layer 108 may be removed selective to the silicon substrate 102, the BOX SiO2 104, the channel layers 112, the sacrificial layers 110, the sacrificial gate 116 and the gate cap 118.

The BDI 122 may be formed where the stack sacrificial layer 108 was removed. The BDI 122 may be formed below a lowermost sacrificial layer 110 of the nanosheet stack and above the BOX SiO2 104.

The dielectric spacer 124 may be formed on vertical side surfaces of the nanosheet stack, including vertical side surfaces of the channel layers 112 and vertical side surfaces of the sacrificial layers 112. The dielectric spacer 124 may be formed on vertical side surfaces of the sacrificial gate 116 and the gate cap 118.

The BDI 122 and the dielectric spacer 124 may be formed by conformally depositing a dielectric material, followed by an isotropic etch. The spacer 124 can be formed by a conformal dielectric material deposition and anisotropic RIE process. The BDI 122 and the dielectric spacer 124 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. In an embodiment, the BDI 122 and the dielectric spacer 124 may each include one or more layers. The BDI 122 and the dielectric spacer 124 may each include any dielectric material such as silicon nitride (SiN), silicon boron carbon nitride (SiBCN), silicon oxide carbon nitride (SiOCN), aluminum oxide (AlOx), SiC, and may include a single layer or may include multiple layers of dielectric material. The BDI 122 and the dielectric spacer 124 may each include the same material or different materials.

Figure 13:
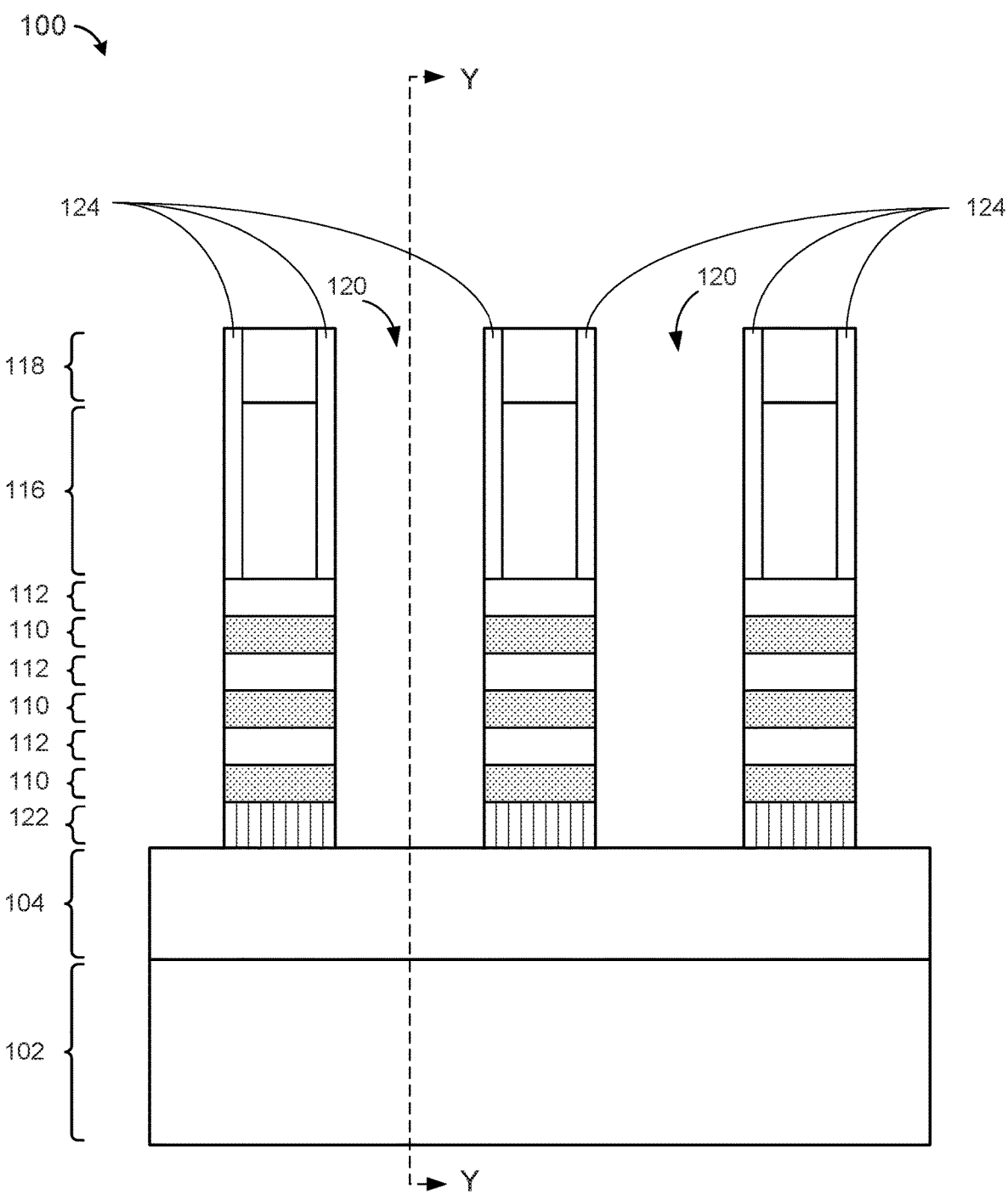
FIGS. 13 and 14 each illustrate a cross-sectional view of the semiconductor structure along section line X-X and Y-Y, respectively, and illustrate selective removal of layers, according to an exemplary embodiment.
Figure 14:
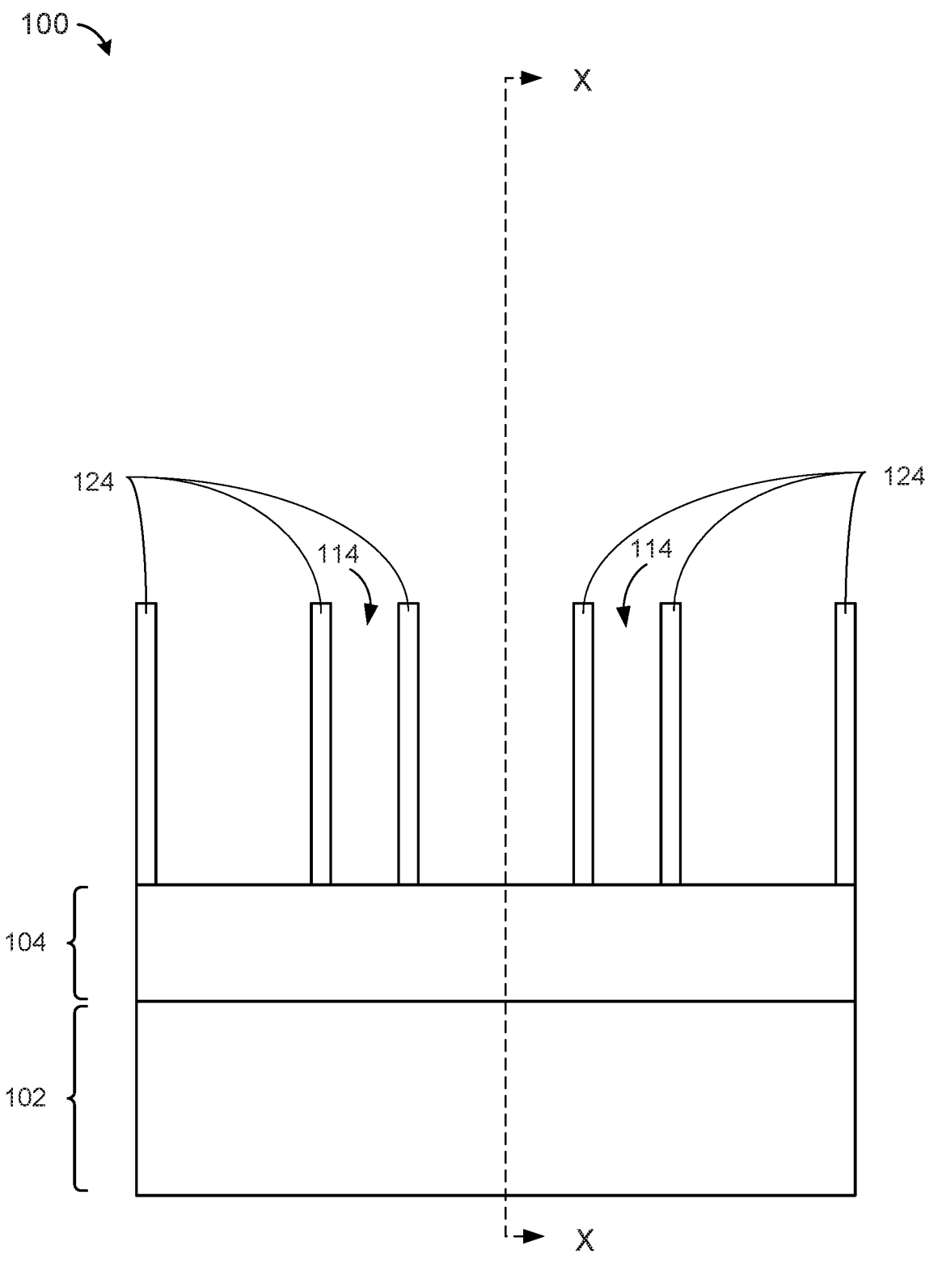

Referring now to FIGS. 13 and 14, the structure 100 is shown according to an exemplary embodiment. FIGS. 13 and 14 are each a cross-sectional view of the structure 100 along section lines X-X and Y-Y, respectively. FIGS. 13 and 14 are perpendicular to each other. A source/drain trench 120 may be formed.

The alternating layers of sacrificial layers 110, channel layers 112 and the BDI 122 may be formed into nanosheet stacks, by methods known in the art. The source/drain trench 120 may have a length perpendicular to section line X-X and parallel to section line Y-Y, and perpendicular to the fins. The source/drain trench 120 may be formed between each sacrificial gate 116 with surrounding dielectric spacers 124 by an anisotropic etching technique, such as, for example, reactive ion etching (RIE), and stopping on etching a portion of the BOX SiO2 104 between each nanosheet stack. The BOX SiO2 104 may provide physical and electrical isolation between adjacent nanosheet stacks.

Each nanosheet stack may include a BDI 122, covered by a sacrificial layer 110, covered by a channel layer 112, covered by a sacrificial layer 110, covered by a channel layer 112, covered by a sacrificial layer 110, covered by a channel layer 112. Above the nanosheet stack is the sacrificial gate 116 and the gate cap 118, with the dielectric spacer 124 on opposite vertical sides. The nanosheet stack may be vertically aligned with the dielectric spacer 124 surrounding the sacrificial gate and the gate cap 118.

As shown in FIG. 14, portions of the nanosheet stack may be removed between adjacent sacrificial gates 116, gate cap 118 and dielectric spacers 124. The dielectric spacer 124 may remain vertically where the nanosheet stack was removed along section line X-X.

Figure 15:
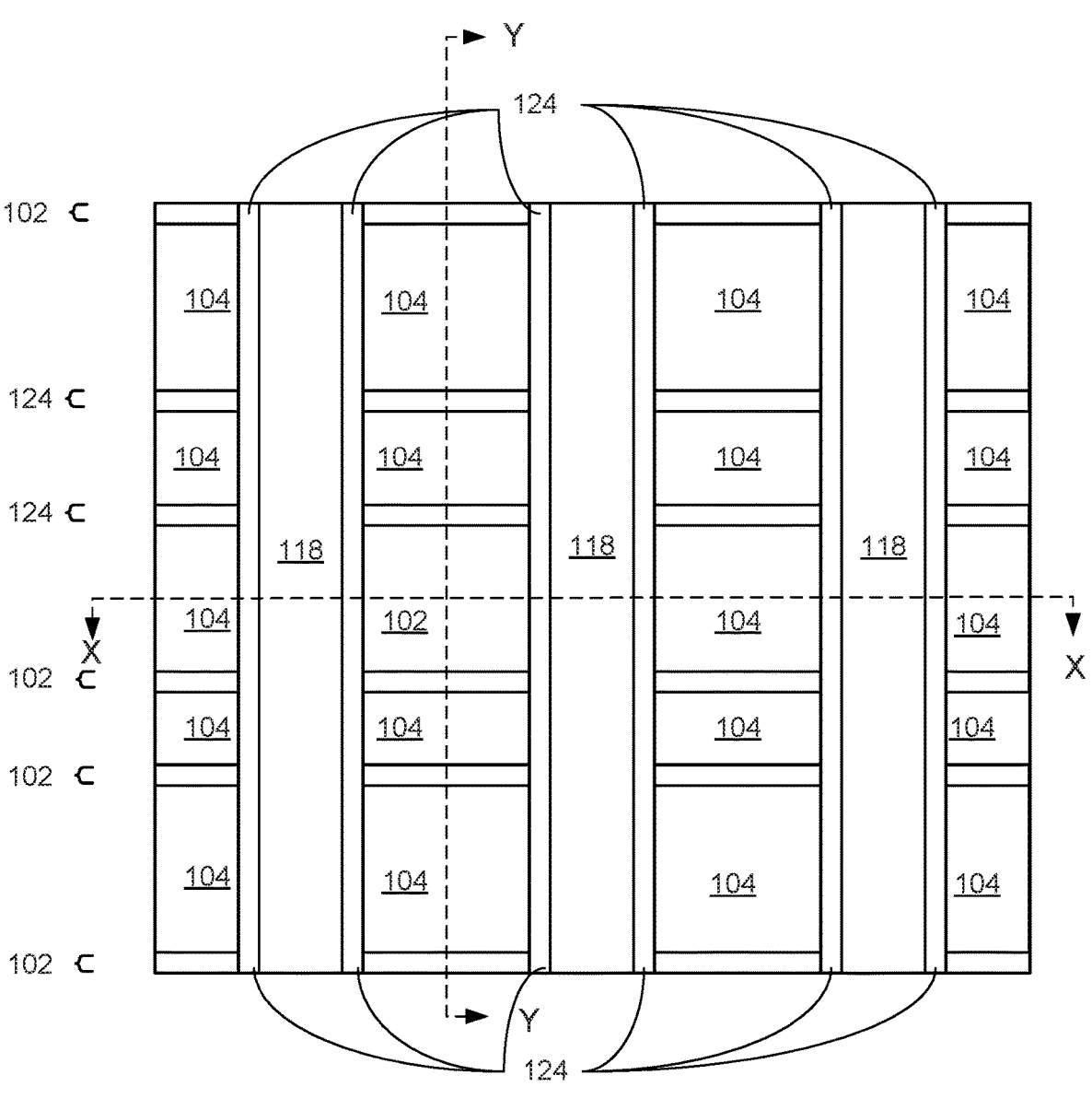
FIG. 15 illustrates a top view of a semiconductor structure and illustrates formation of an organic patterning layer, according to an exemplary embodiment.
Figure 16:
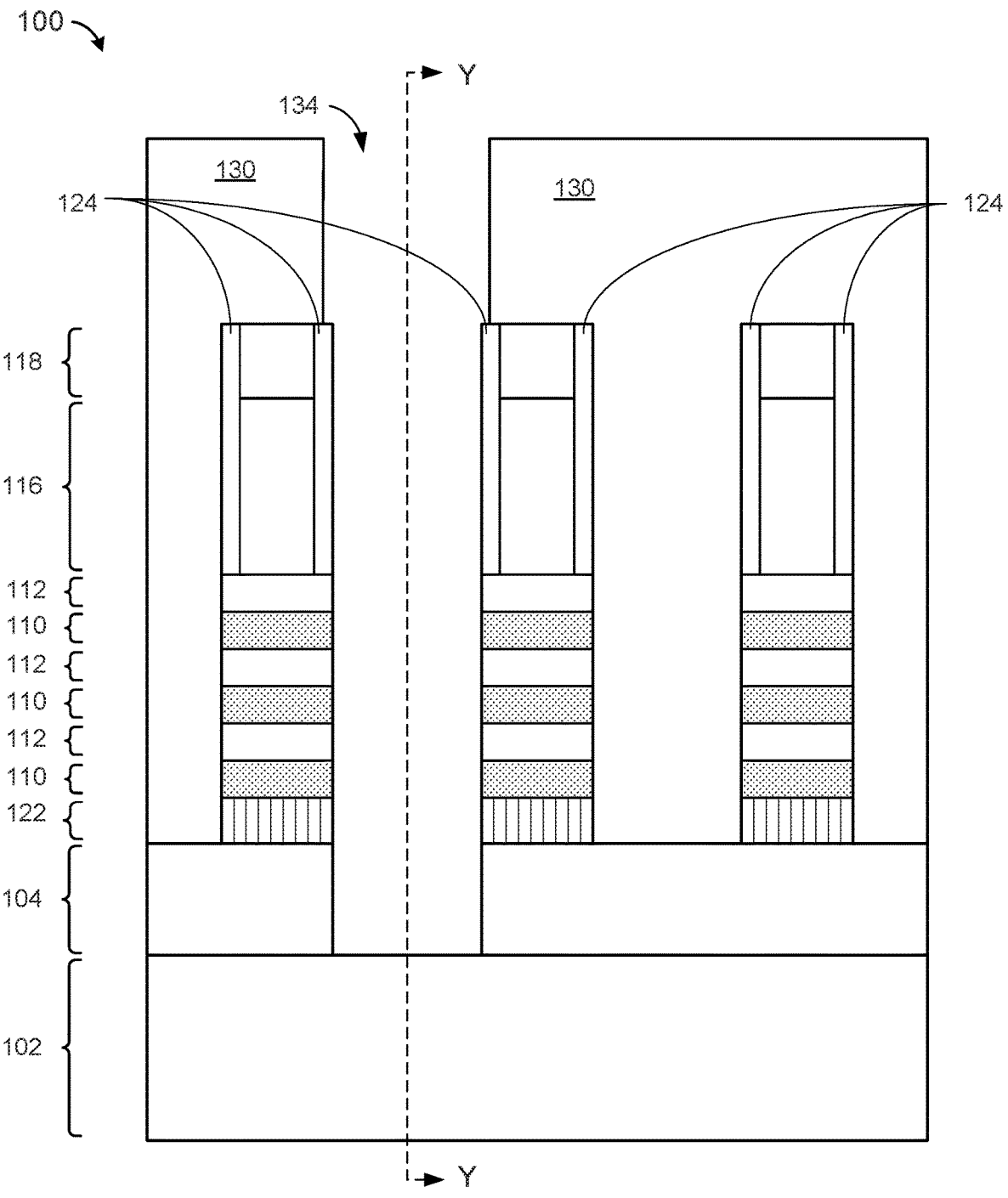
FIGS. 16 and 17 each illustrate a cross-sectional view of the semiconductor structure of FIG. 15 along section line X-X and Y-Y, respectively, according to an exemplary embodiment.
Figure 17:
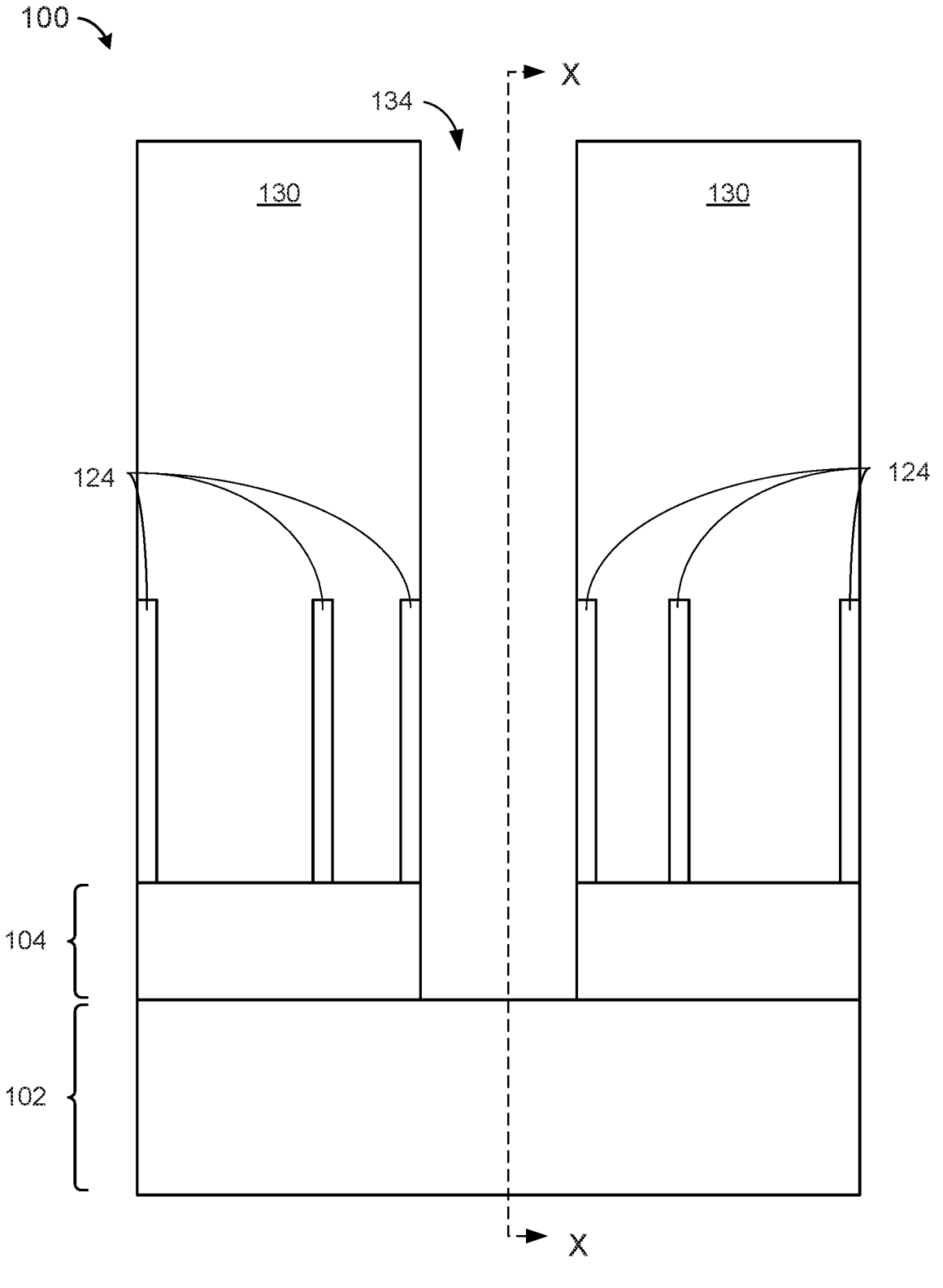

Referring now to FIGS. 15, 16 and 17, the structure 100 is shown according to an exemplary embodiment. FIG. 15 is a top view of the structure 100. FIGS. 16 and 17 are each a cross-sectional view of the structure 100 along section lines X-X and Y-Y, respectively. FIGS. 16 and 17 are perpendicular to each other. A backside contact trench 134 may be patterned in the BOX SiO2 104 using conventional lithography and etching process. A lithography soft mask, such as an organic planarization layer 130 (hereinafter "OPL") may be used for the patterning process.

The OPL 130 may be formed by a blanket deposition using typical deposition techniques, for example spin-on coating. The OPL 130 can be a self-planarizing organic material that includes carbon, hydrogen, oxygen, and optionally nitrogen, fluorine, and silicon. The OPL 130 can be a standard $C_xH_y$ polymer. Non-limiting examples of materials include, but are not limited to, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

A dry etch technique may be used to selectively remove a portion of the OPL 130 which is subsequently used to form the backside contact trench 134.

The backside contact trench 134 may be formed between an adjacent pair of sacrificial gates 116, gate cap 118 and dielectric spacers 124 surrounding each sacrificial gate 116, above adjacent nanosheet stacks, as shown in the section line X-X of FIG. 12. The backside contact trench 134 may be formed between a pair of dielectric spacers 124 where a portion of a nanosheet stack was removed between adjacent sacrificial gates 116, as shown in the section line Y-Y of FIG. 13.

The backside contact trench 134 may be formed by an anisotropic etching technique, such as, for example, reactive ion etching (RIE), removing aligned portions of the OPL 130 and the BOX SiO2 104, and stopping on etching a portion of the silicon substrate 102.

The backside contact trench 134 can facilitate forming a self-aligned backside contact. The backside contact trench 134 may be formed in select areas of the structure 100 where a future bottom contact may be formed to a subsequently formed source drain. There may be one or more backside contact trenches 134 on the structure 100.

Figure 18:
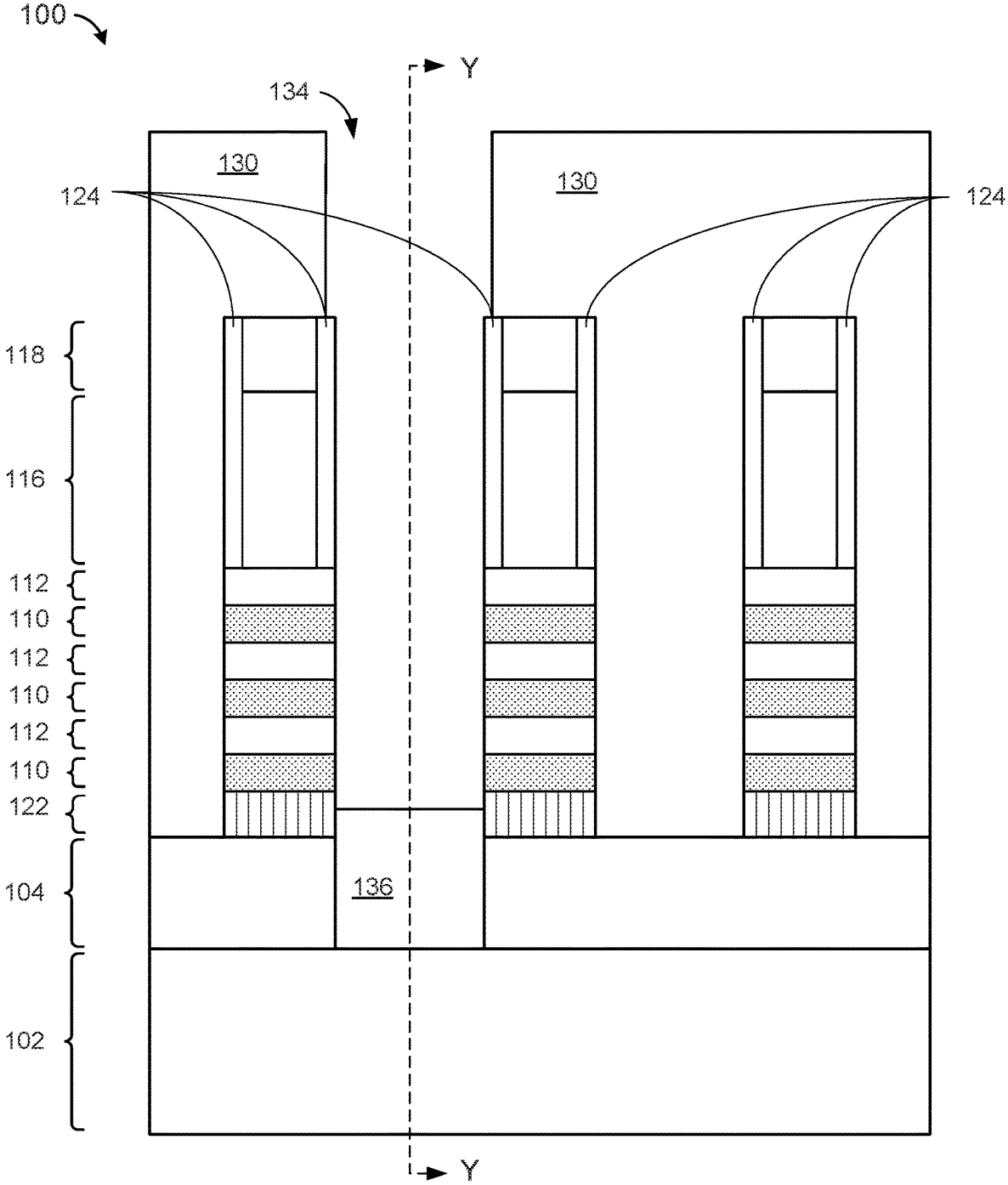
FIGS. 18 and 19 each illustrate a cross-sectional view of the semiconductor structure along section line X-X and Y-Y, respectively, and illustrate formation of a sacrificial backside contact placeholder, according to an exemplary embodiment.
Figure 19:
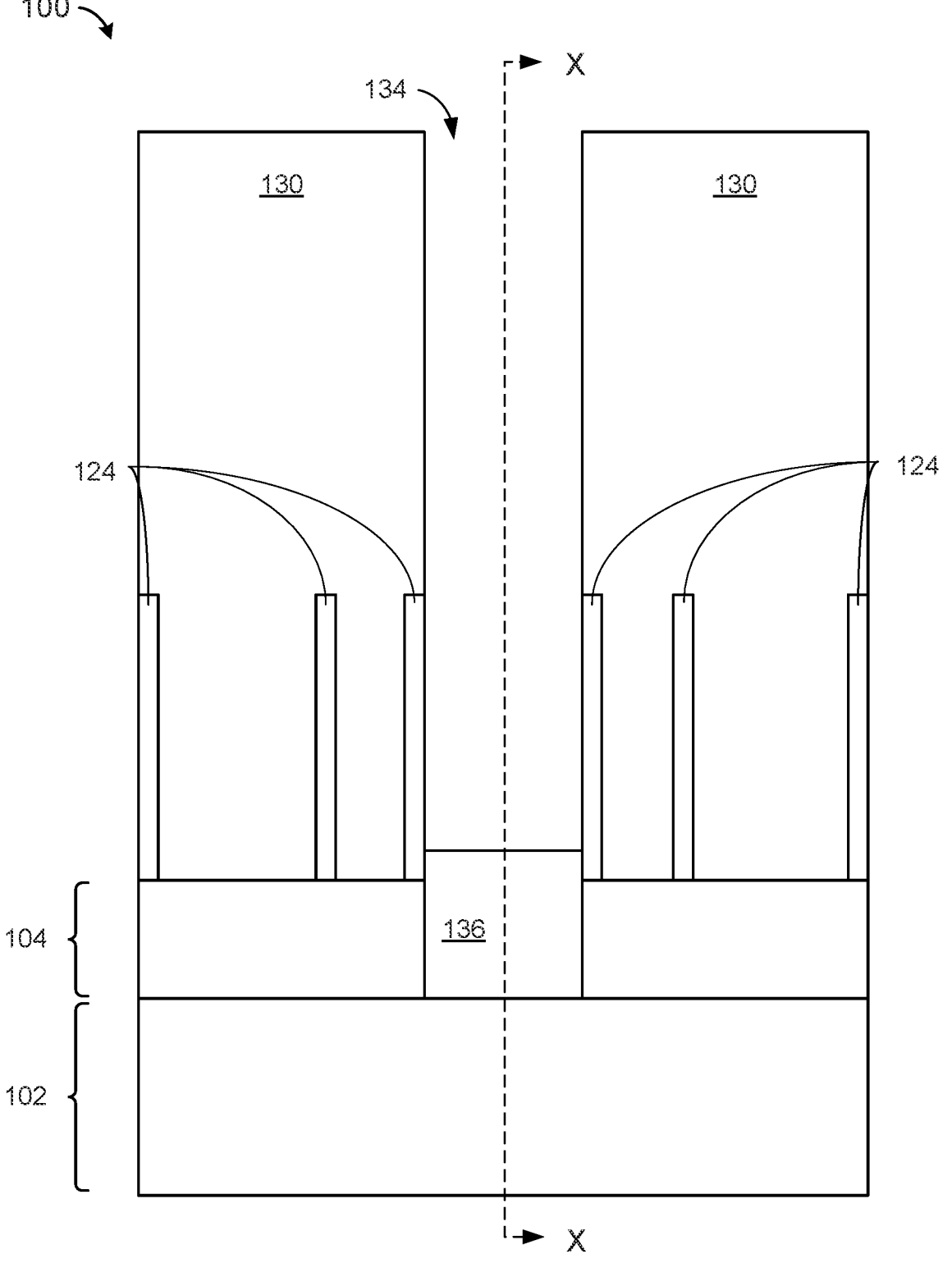

Referring now to FIGS. 18 and 19, the structure 100 is shown according to an exemplary embodiment. FIGS. 18 and 19 are each a cross-sectional view of the structure 100 along section lines X-X and Y-Y, respectively. FIGS. 18 and 19 are perpendicular to each other. A sacrificial backside contact placeholder 136 may be formed.

The sacrificial backside contact placeholder 136 may be formed in the backside contact trench 134, filling a portion of the backside contact trench 134. A lower surface of the sacrificial backside contact placeholder 136 may be adjacent to an upper surface of the silicon substrate 102. Vertical side surfaces of the sacrificial backside contact placeholder 136 may be adjacent to vertical side surfaces of the BOX SiO2 104. A portion of the vertical side surfaces of the sacrificial backside contact placeholder 136 may be adjacent to a portion of vertical side surfaces of the dielectric spacer 124 which surround the backside contact trench 134. A portion of the vertical side surfaces of the sacrificial backside contact placeholder 136 may be adjacent to a portion of a vertical side surface of the BDI 122.

The sacrificial backside contact placeholder 136 may be formed by conformally depositing or growing a sacrificial material, followed by a combination of dry and wet anisotropic etch and recessing steps. The sacrificial backside contact placeholder 136 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an anisotropic vertical etch process such as a reactive ion etch (RIE), or any suitable etch process. The sacrificial placeholder material can also be selectively grown from substrate 102 by epitaxy, such as semiconductor materials. In an embodiment, the sacrificial backside contact placeholder 136 may include one or more layers. In an embodiment, the sacrificial backside contact placeholder 136 may include any material that can be selectively removed layer with respect to the BOX SiO2 104, such as SiGe, Ge, III-V semiconductor, silicon oxynitride, silicon nitride, SiBCN, SiOC, SiC, AlOx, TiOx or any combination of these materials.

Figure 20:
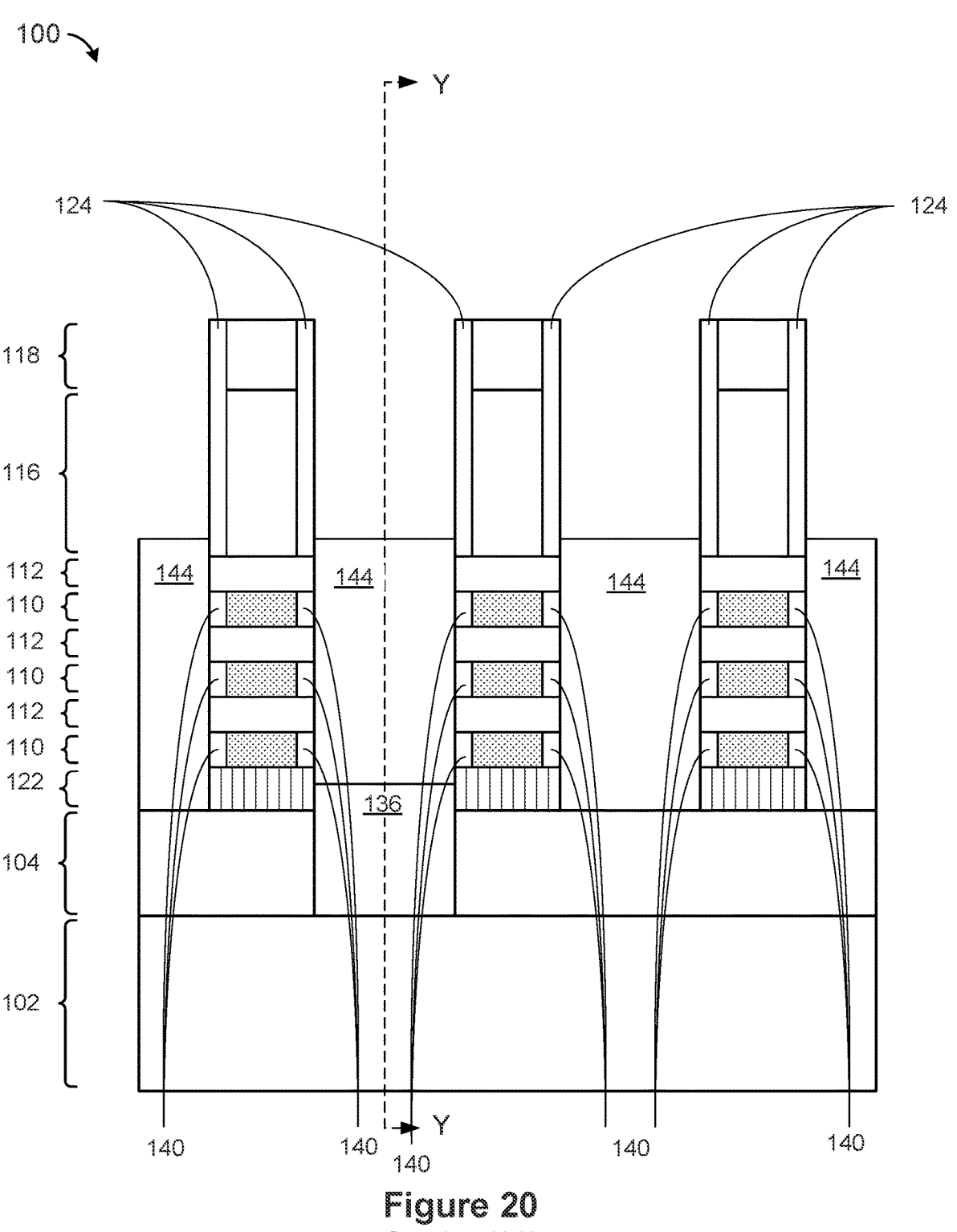
FIGS. 20 and 21 each illustrate a cross-sectional view of the semiconductor structure along section line X-X and Y-Y, respectively, and illustrate formation of inner spacers and a source drain, according to an exemplary embodiment.
Figure 21:
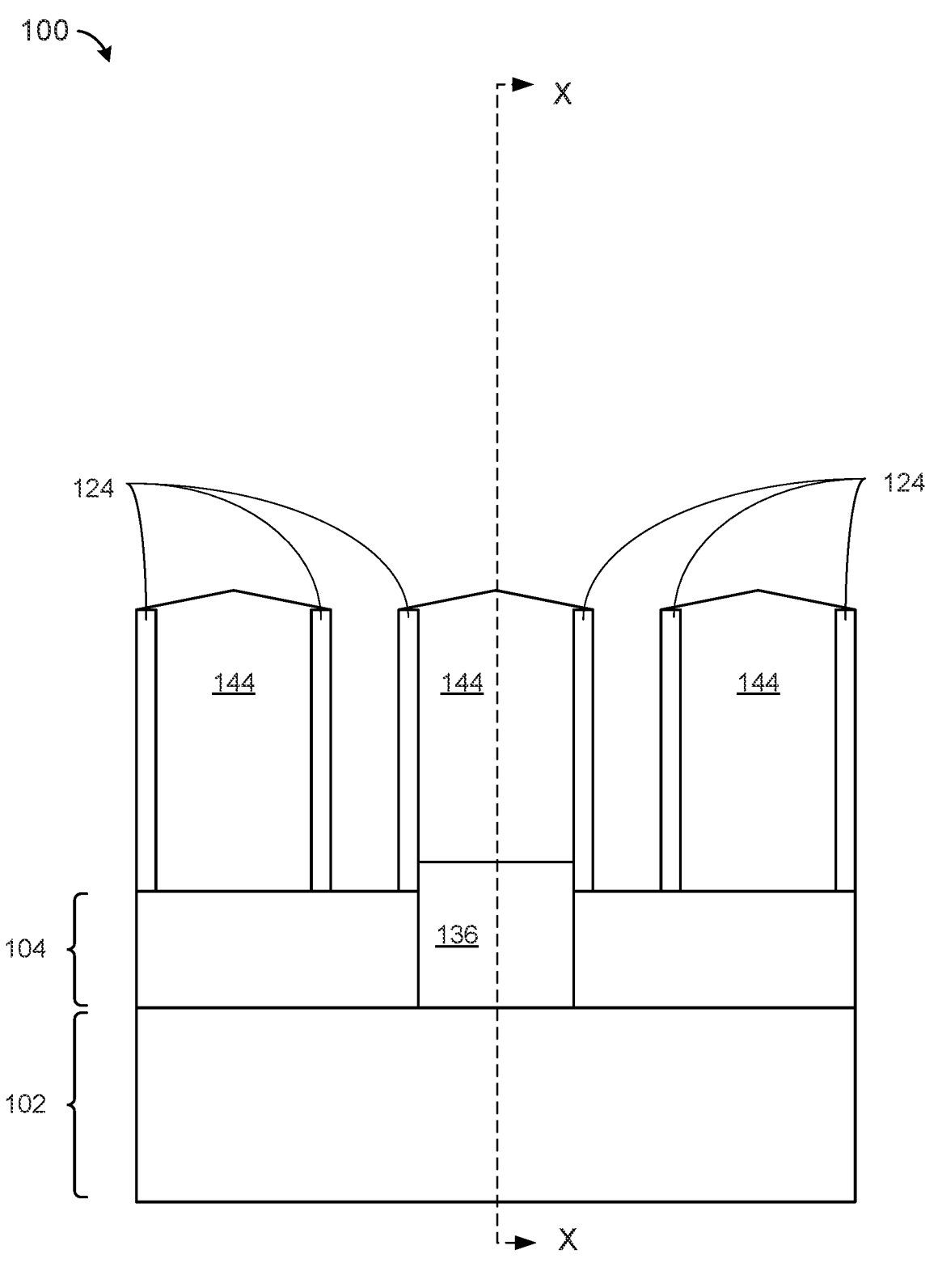

Referring now to FIGS. 20 and 21, the structure 100 is shown according to an exemplary embodiment. FIGS. 20 and 21 are each a cross-sectional view of the structure 100 along section lines X-X and Y-Y, respectively. FIGS. 20 and 21 are perpendicular to each other. The OPL 130 may be removed. Outer portions of the sacrificial layers 110 may be removed. Inner spacers 140 may be formed. A source drain 144 may be formed.

A wet etching or dry ashing technique may be used to selectively remove the OPL 130 selective to the silicon substrate 102, the BOX SiO2 104, the sacrificial layers 110, the channel layers 112, the sacrificial gate 116, the gate cap 118, the BDI 122, the dielectric spacer 124 and the sacrificial backside contact placeholder 136.

Outer portions of the sacrificial layers 110 may be selectively removed using known techniques. For example, a wet or dry etch process can be used with the appropriate chemistry to remove portions of each of the sacrificial layers 110. The material used for the etching process may be selective such that the channel layers 112, the sacrificial backside contact placeholder 136, the dielectric spacer 124, the BDI 122, the gate cap 118, the sacrificial gate 116, the channel layers 112, the BOX SiO2 104 and the silicon substrate 102 remain and are not etched. After etching, portions of the sacrificial layers 110 covered on opposite sides by the sacrificial gate 116 may remain as part of the nanosheet stack.

The inner spacer 140 may be formed by conformally depositing or growing a dielectric material, followed by a combination of dry and wet isotropic etch and recessing steps. The inner spacer 140 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by an isotropic etch process such as a wet etch process, or any suitable etch process. In an embodiment, the inner spacer 140 may include one or more layers. In an embodiment, the inner spacer 140 may include any dielectric material such as, silicon oxynitride, silicon nitride, SiBCN, SiOC, or any combination of these materials.

The inner spacer 140 may completely fill in spaces between the channel layers 112, where the portions of the sacrificial layers 110 had been previously removed.

A vertical side surface of the inner spacer 140 may be aligned with a vertical side surface of the channel layers 112 and a vertical side surface of the dielectric spacer 124 surrounding the sacrificial gate 116 and the gate cap 118.

The source drain 144 may be epitaxially grown surrounding a vertical portion of the nanosheet stack on opposite sides of the sacrificial gate 116. A lower surface of the source drain 144 may be adjacent to an upper surface of the sacrificial backside contact placeholder 136. A lower surface of the source drain 144 may be adjacent to an upper surface of the BOX SiO2 104, in those areas without the sacrificial backside contact placeholder 136. A vertical side surface of the source drain 144 may be adjacent to vertical side surfaces of the inner spacer 140, vertical side surfaces of the BDI 122 and vertical side surfaces of the channel layers 112. An upper surface of the source drain 144 may be a greater distance from the BOX SiO2 104 than an upper surface of the uppermost channel layer 112.

Figure 22:
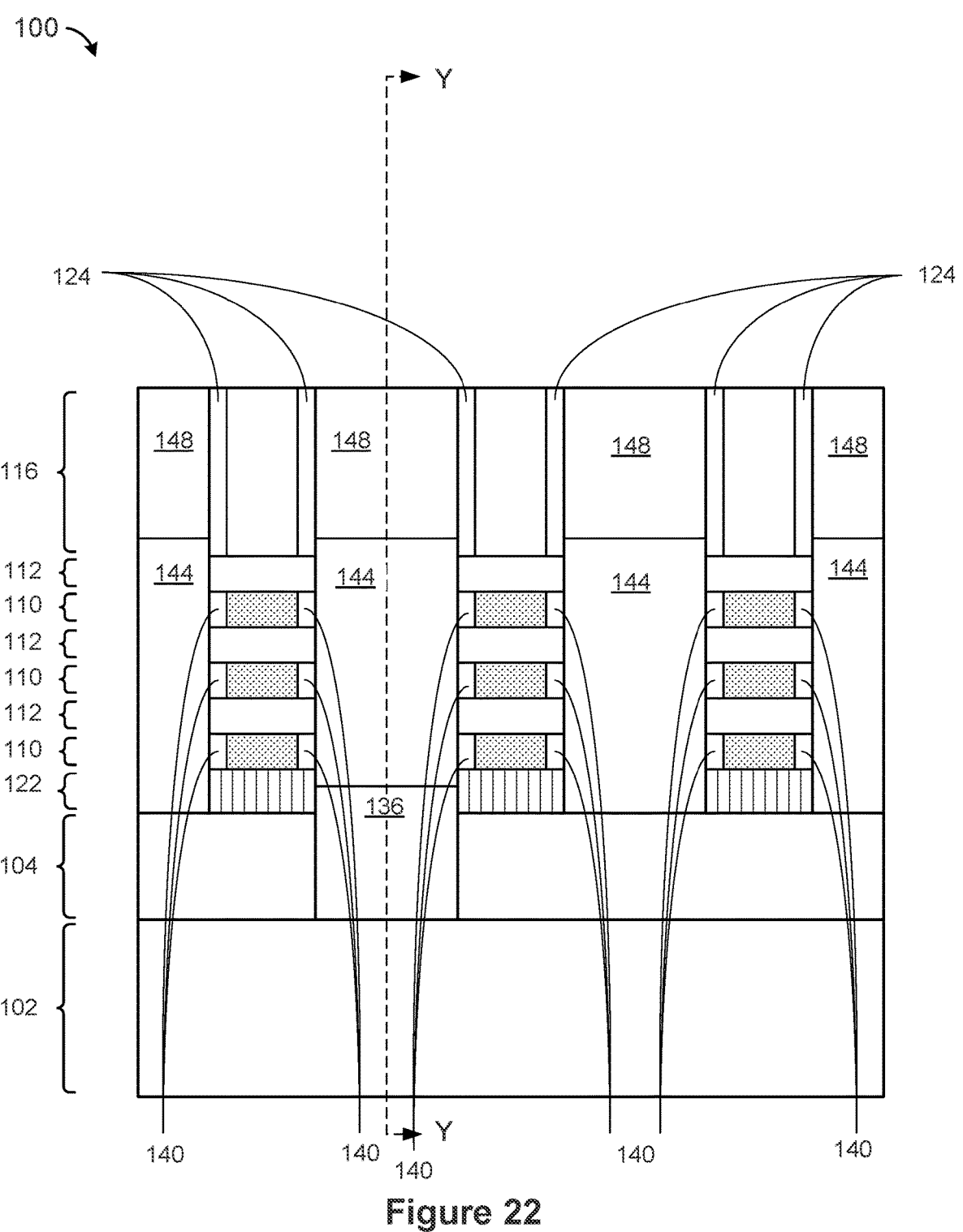
FIGS. 22 and 23 each illustrate a cross-sectional view of the semiconductor structure along section line X-X and Y-Y, respectively, and illustrate formation of an inter-layer dielectric, according to an exemplary embodiment.
Figure 23:
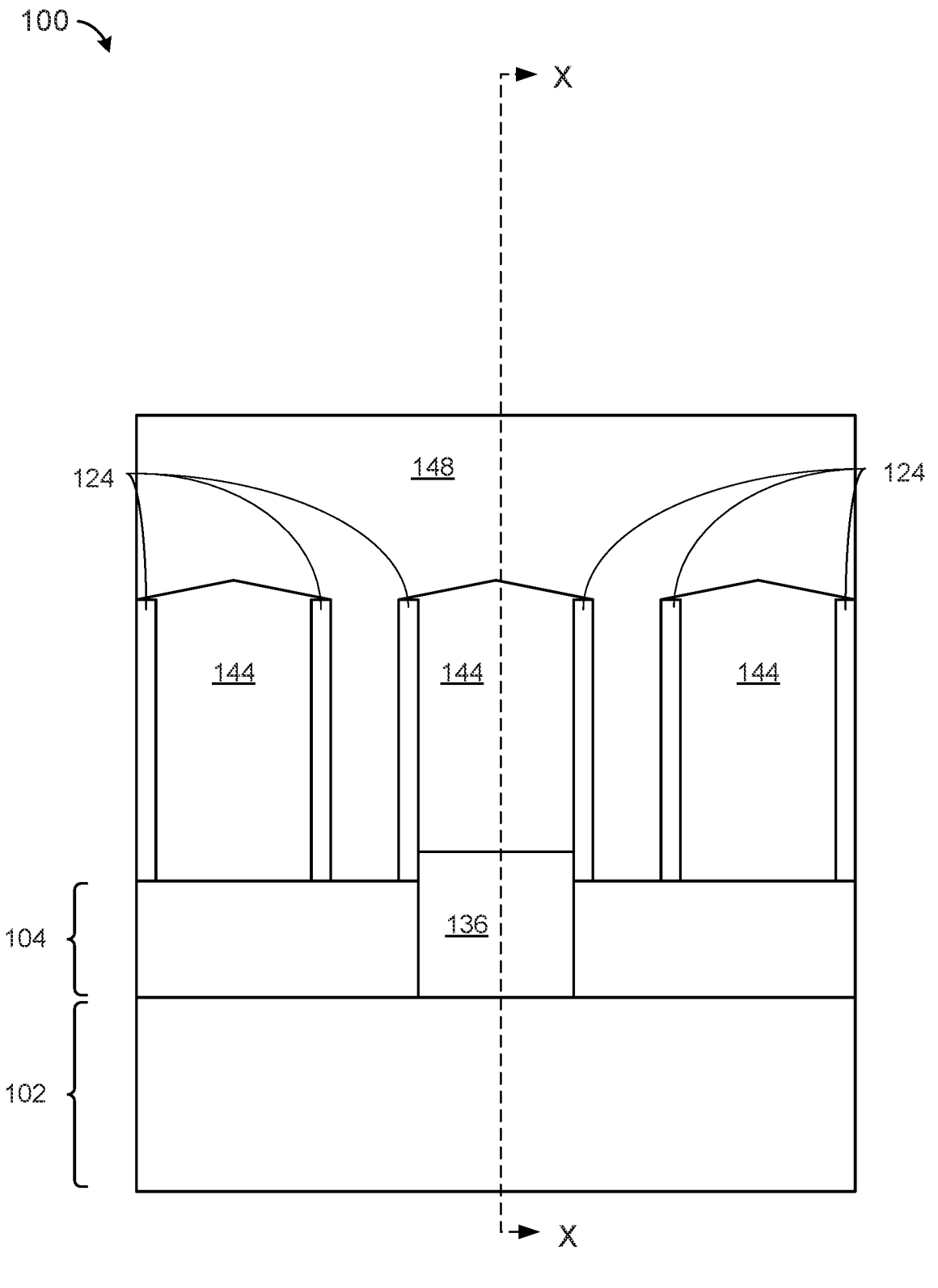

Referring now to FIGS. 22 and 23, the structure 100 is shown according to an exemplary embodiment. FIGS. 22 and 23 are each a cross-sectional view of the structure 100 along section lines X-X and Y-Y, respectively. FIGS. 22 and 23 are perpendicular to each other. An inter-layer dielectric (hereinafter "ILD") 148 may be formed.

The ILD 148 may be formed by conformally depositing or growing a dielectric material, followed by a CMP or etch steps. The ILD 148 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques, followed by a planarization process, such as CMP, or any suitable etch process. In an embodiment, the ILD 148 may include one or more layers. In an embodiment, the ILD 148 may include any dielectric material such as silicon oxide, silicon oxynitride, silicon nitride, SiBCN, SiOC, low-k dielectric or any combination of these materials. A lower surface of the ILD 148 may be adjacent to an upper surface of the source drain 144. An additional lower surface of the ILD 148 may be adjacent to an upper surface of the box 104. A vertical side surface of the ILD 148 may be adjacent to a vertical side surface of the dielectric spacer 124.

A chemical mechanical polishing (CMP) technique may be used to remove excess material and polish upper surfaces of the structure 100, removing the gate cap 118 and exposing an upper horizontal surface of the sacrificial gate 116. An upper surface of the structure 100 may also include an upper horizontal surface of the ILD 148 and an upper horizontal surface of the dielectric spacer 124.

Figure 24:
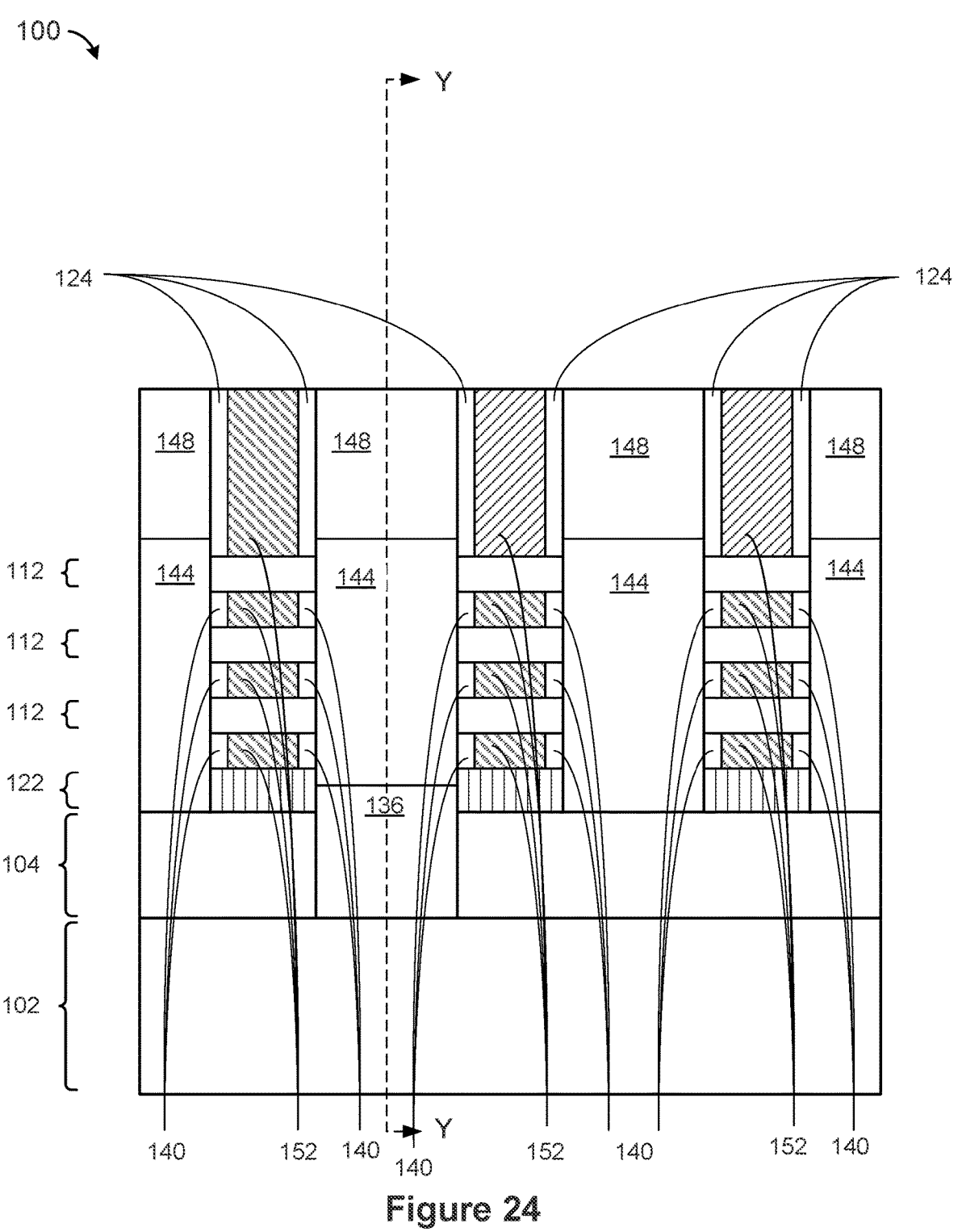
FIGS. 24 and 25 each illustrate a cross-sectional view of the semiconductor structure along section line X-X and Y-Y, respectively, and illustrate removal of the sacrificial gate and the sacrificial layers and formation of a replacement high-k metal gate, according to an exemplary embodiment.
Figure 25:
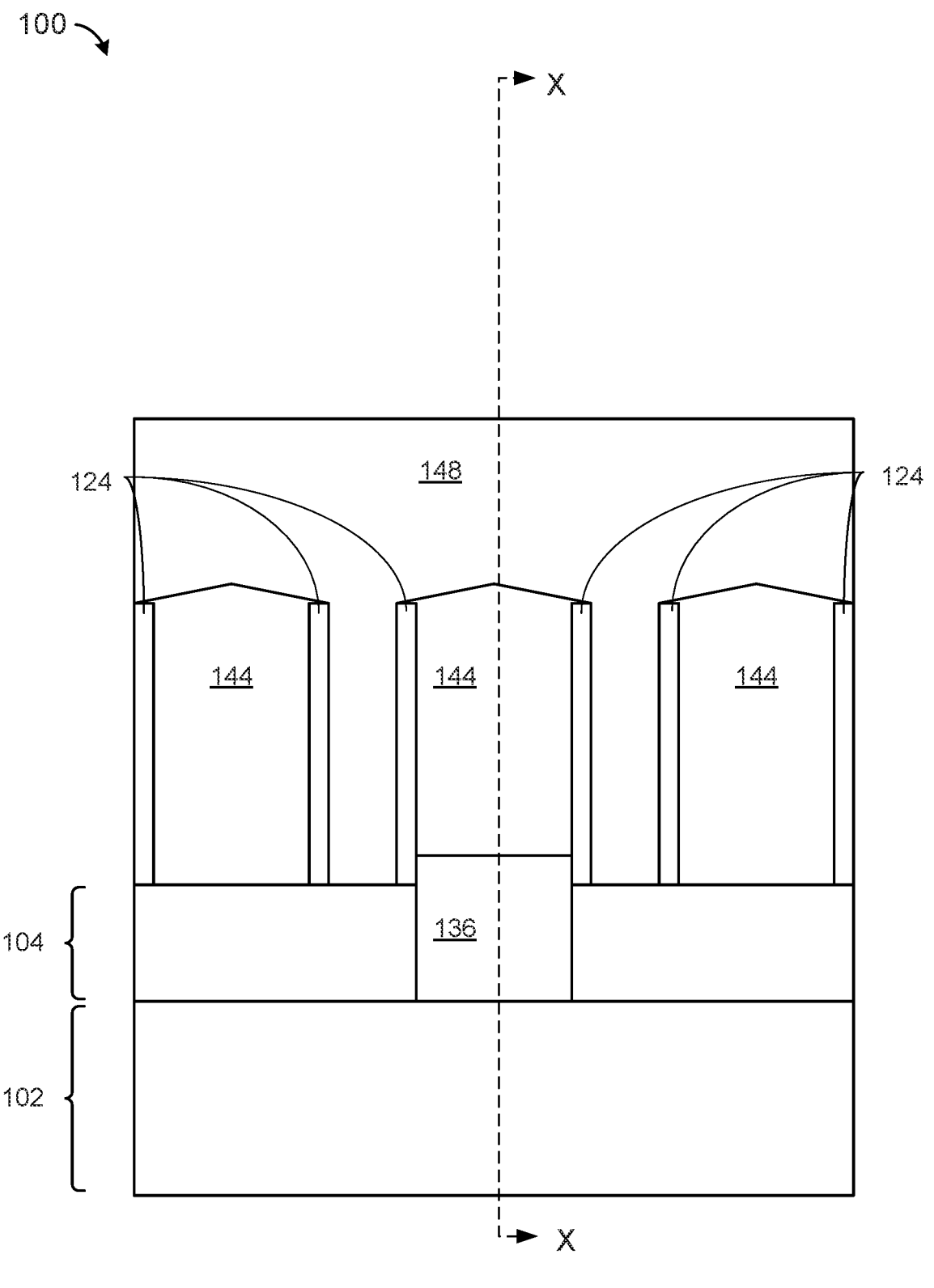

Referring now to FIGS. 24 and 25, the structure 100 is shown according to an exemplary embodiment. FIGS. 24 and 25 are each a cross-sectional view of the structure 100 along section lines X-X and Y-Y, respectively. FIGS. 24 and 25 are perpendicular to each other. The sacrificial gate 116 may be removed. The sacrificial layers 110 may be removed. A high-k metal gate 152 may be formed.

The sacrificial gate 116 may be removed by methods known in the arts. The sacrificial layers 110 are removed selective to the channel layers 112, the inner spacers 140, the ILD 148, the dielectric spacer 124, the BDI 122, the sacrificial backside contact placeholder 136, the BOX SiO2 104 and the silicon substrate 102. For example, a dry etch process can be used to selectively remove the sacrificial layers 110, such as using vapor phased HCl dry etch. An upper surface and a lower surface of the channel layers 112 may be exposed. An upper surface of the BDI 122 may be exposed.

The high-k metal gate 152 may be conformally formed on the structure 100, according to an exemplary embodiment. The high-k metal gate 152 is formed in each cavity of the nanosheet stack and surrounding suspended portions of the channel layers 112. The high-k metal gate 152 forms a layer surrounding exposed portions of the nanosheet stacks. The high-k metal gate 152 may cover an exposed upper horizontal surface of the BDI 122, exposed vertical side surfaces of one side of the side spacers 140, exposed vertical surfaced of one side of the dielectric spacer 124 and the exposed upper horizontal surfaces of the BDI 122. The high-k metal gate 152 may cover vertical side surfaces, an upper horizontal surface and a lower horizontal surface of the channel layers 110. The high-k metal gate 152 may fill a space between the dielectric spacer 124 above the nanosheet stack, where the sacrificial gate 116 was removed.

The high-k metal gate 152 may be deposited using typical deposition techniques, for example, atomic layer deposition (ALD), molecular layer deposition (MLD), and chemical vapor deposition (CVD). In an embodiment, the high-k metal gate 152 may include more than one layer, for example, a conformal layer of a high-k dielectric material such as $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. In an embodiment, a work function metal of a p-FET device may include a metal nitride, for example, titanium nitride or tantalum nitride, titanium carbide titanium aluminum carbide, or other suitable materials known in the art. In an embodiment, the work function metal of an n-FET device may include, for example, titanium aluminum carbide or other suitable materials known in the art. In an embodiment, the work function metal may include one or more layers to achieve desired device characteristics.

A chemical mechanical polishing (CMP) technique may be used to remove excess material and polish upper surfaces of the structure 100. An upper surface of the structure 100 may include an upper horizontal surface of the ILD 148, an upper horizontal surface of the dielectric spacer 124 and an upper horizontal surface of the high-k metal gate 152.

Figure 26:
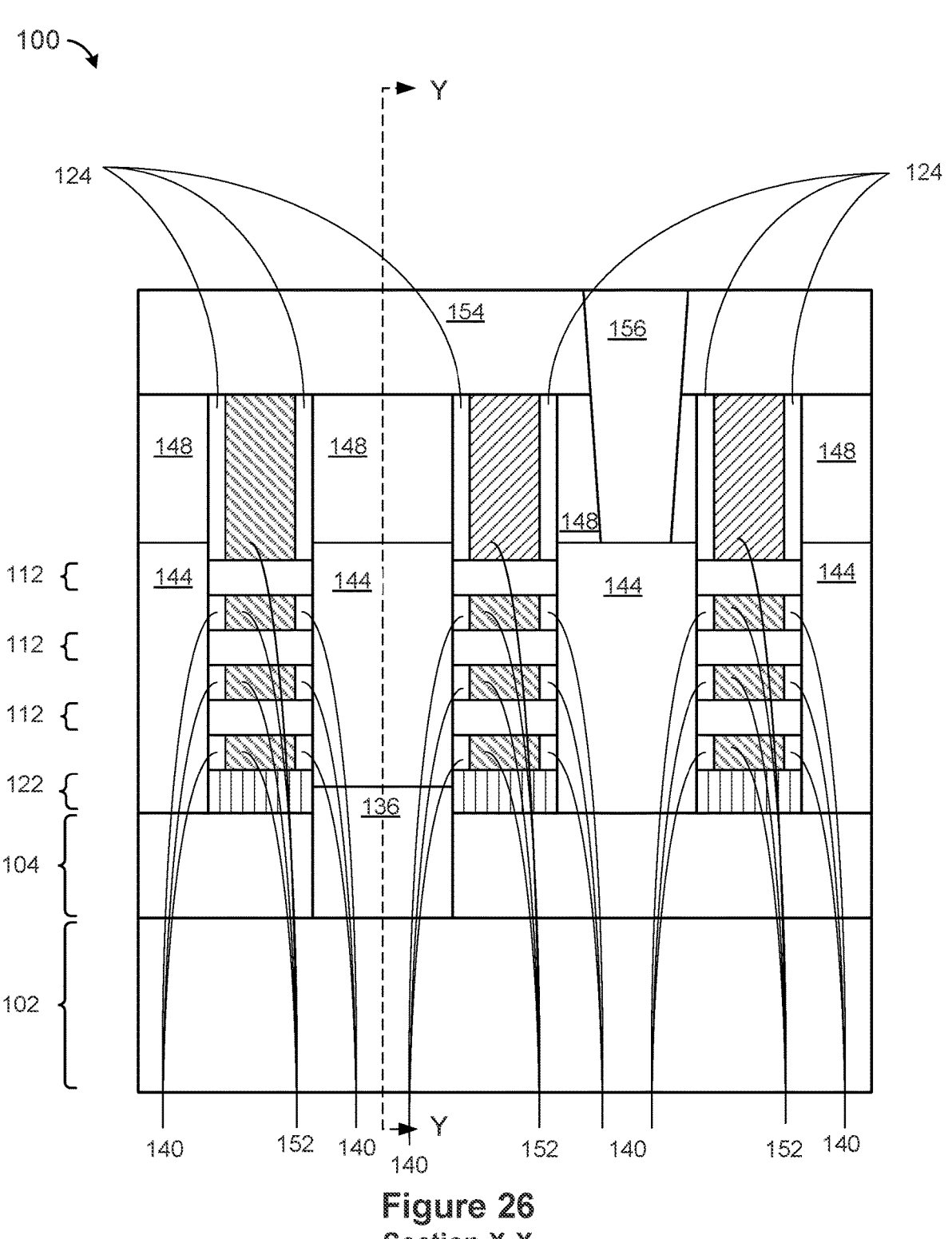
FIGS. 26 and 27 each illustrate a cross-sectional view of the semiconductor structure along section line X-X and Y-Y, respectively, and illustrate formation of an inter-layer dielectric and a contact, according to an exemplary embodiment.
Figure 27:
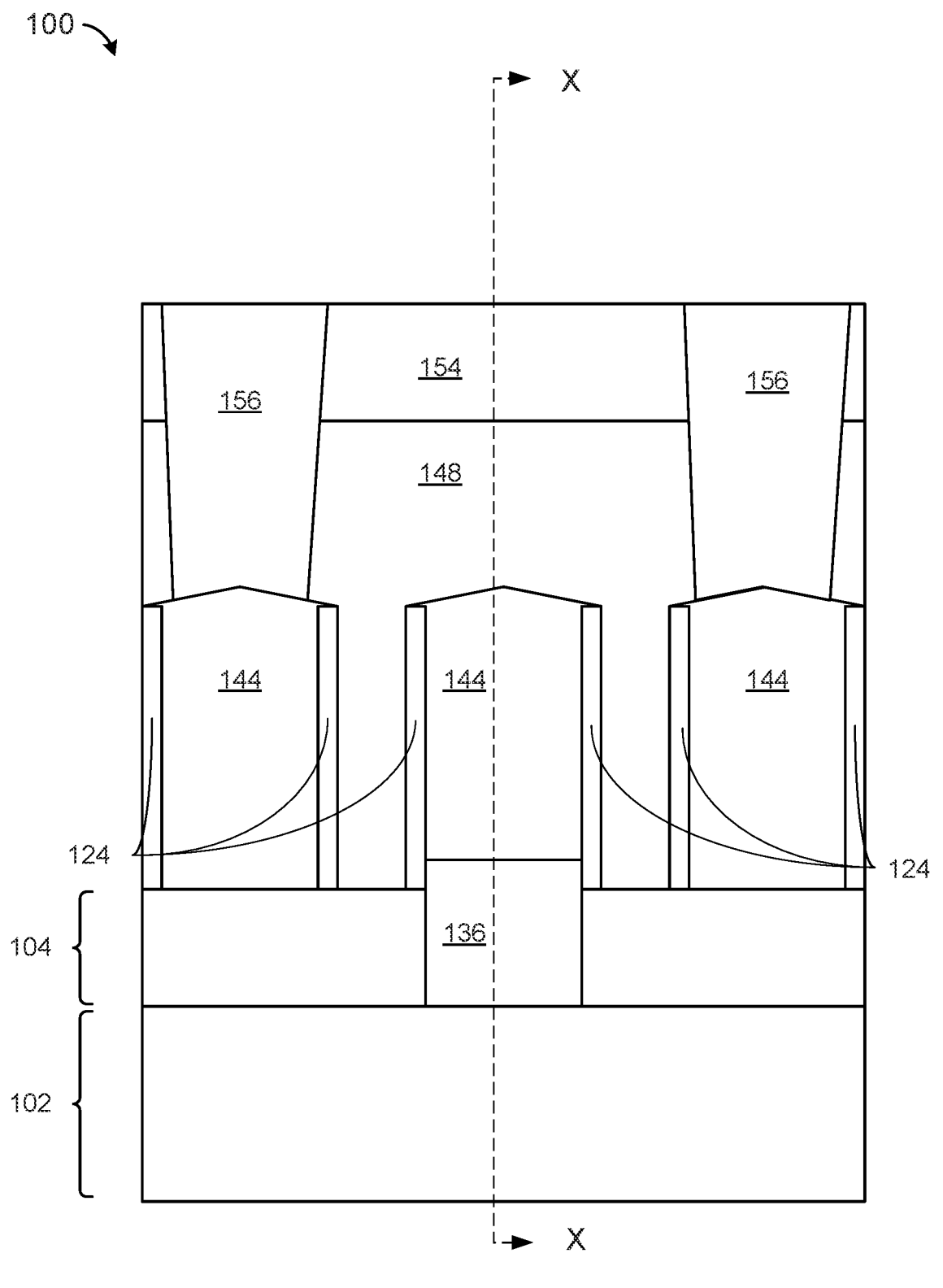

Referring now to FIGS. 26 and 27, the structure 100 is shown according to an exemplary embodiment. FIGS. 26 and 27 are each a cross-sectional view of the structure 100 along section lines X-X and Y-Y, respectively. FIGS. 26 and 27 are perpendicular to each other. An inter-layer dielectric (hereinafter "ILD") 154 may be formed. An upper contact 156 may be formed.

The ILD 154 may be conformally formed as described for the ILD 148. A lower horizontal surface of the ILD 154 may be adjacent to an upper horizontal surface of the high-k metal gate 152, an upper horizontal surface of the dielectric spacer 124 and an upper horizontal surface of the ILD 148.

An opening (not shown) may be made in the structure 100 through the ILD 154 and the ILD 148 exposing an upper horizontal surface of the source drain 144. The upper contact 156 may be formed in the opening (not shown) to form a contact to the source drain 144. As shown in FIG. 23, there are 2 upper contacts 156. There may be any number of upper contacts 156 on the structure 100.

The upper contacts 156 may be made to the source drain 144 which does not have a sacrificial backside contact placeholder 136 below the source drain 144. The source drain 144 which has a sacrificial backside contact placeholder 136 may have a bottom contact as formed in later processing steps. Each of the source drains 144 may have either an upper contact 156 or a bottom contact.

A chemical mechanical polishing (CMP) technique may be used to remove excess material and polish upper surfaces of the structure 100, exposing an upper horizontal surface of the ILD 154 and an upper horizontal surface of the upper contact 156.

Figure 28:
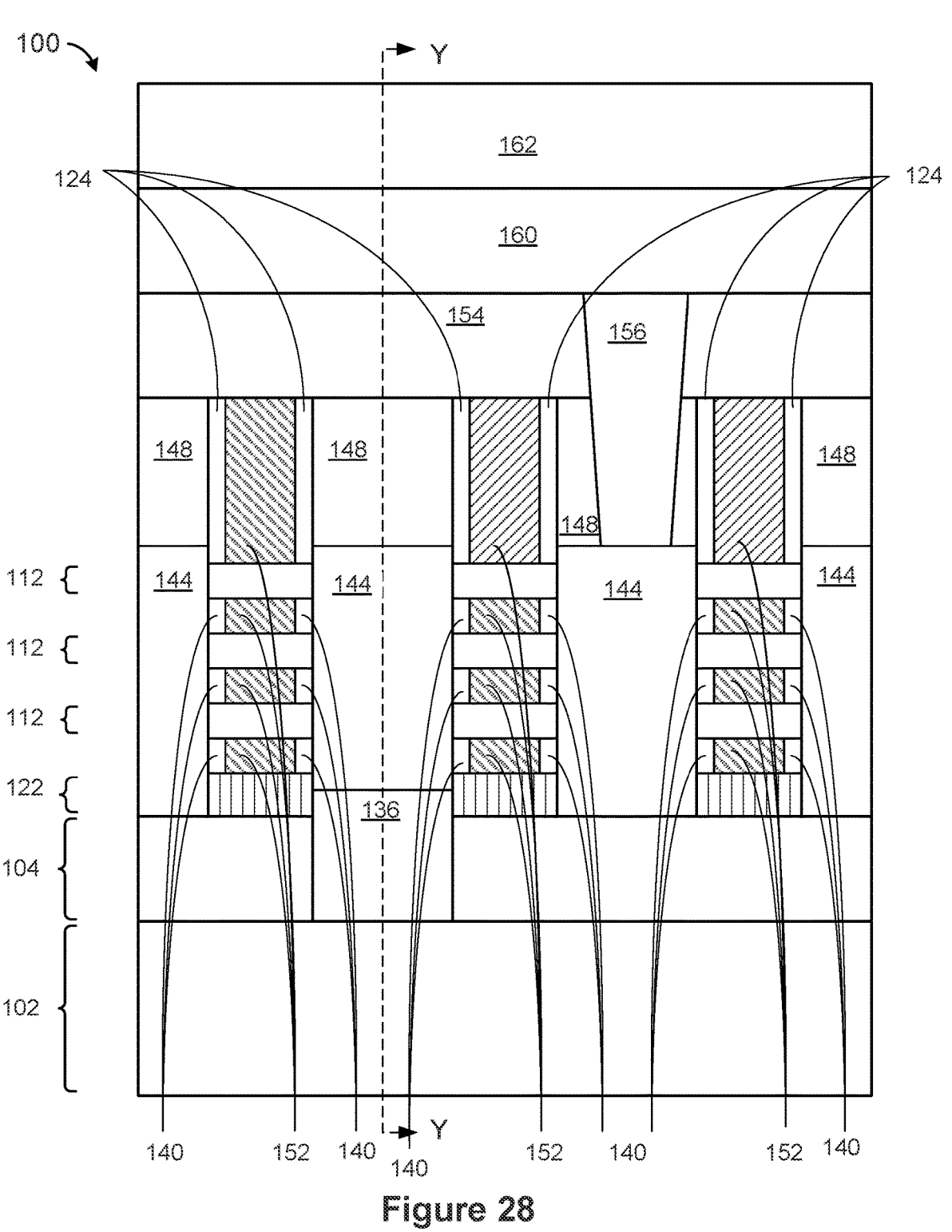
FIGS. 28 and 29 each illustrate a cross-sectional view of the semiconductor structure along section line X-X and Y-Y, respectively, and illustrate formation of back end of line layers and bonding of a carrier wafer to the semiconductor structure, according to an exemplary embodiment.
Figure 29:
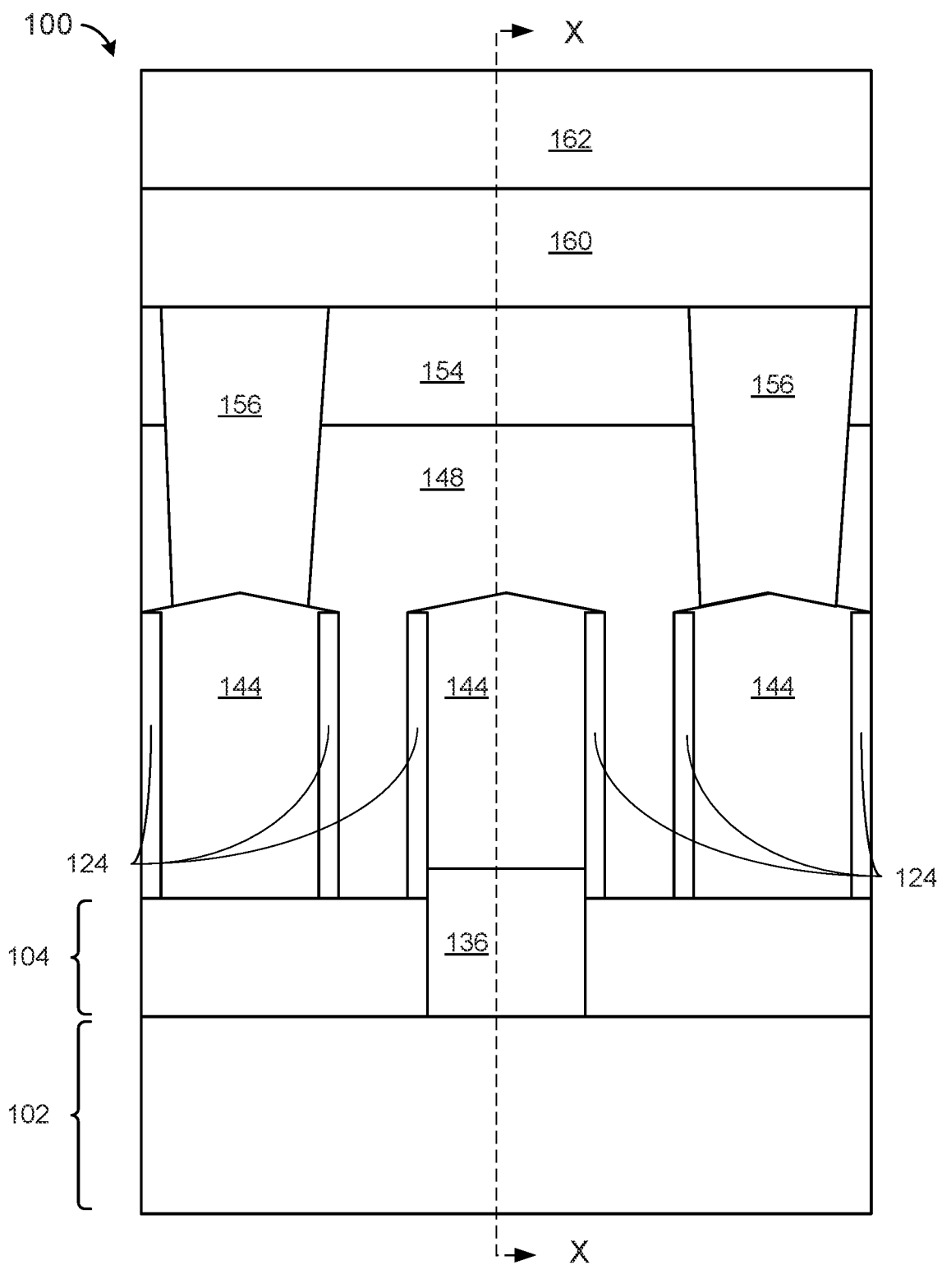

Referring now to FIGS. 28 and 29, the structure 100 is shown according to an exemplary embodiment. FIGS. 28 and 29 are each a cross-sectional view of the structure 100 along section lines X-X and Y-Y, respectively. FIGS. 28 and 29 are perpendicular to each other. Back end of line (hereinafter "BEOL") layers 160 (hereinafter "BEOL") may be formed. A carrier wafer 162 may be bonded to the structure 100.

The BEOL layers 160 may be include layers of wiring and vias formed above the existing structure, above the contact 145 and the ILD 154. In an embodiment, the BEOL layers 160 may include 12 or more layers of metal lines and visas. The BEOL layers 160 may be formed using known techniques.

The carrier wafer 162 may be attached to an upper surface of the structure 100, mounted on an upper surface of the BEOL layers 160. The carrier wafer may be attached using conventional wafer bonding process, such as dielectric-to-dielectric bonding or copper-to-copper bonding process.

Figure 30:
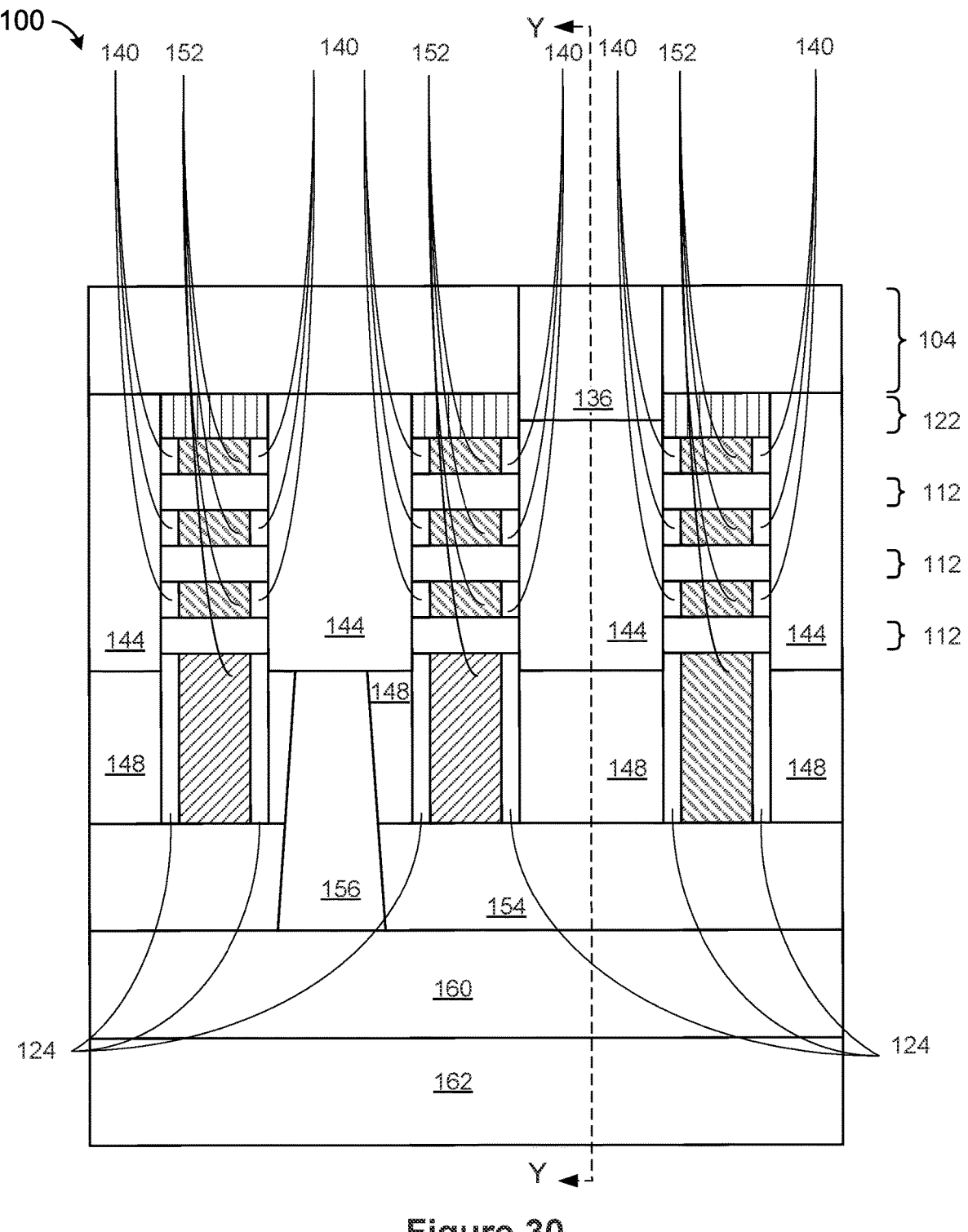
FIGS. 30 and 31 each illustrate a cross-sectional view of the semiconductor structure along section line X-X and Y-Y, respectively, and illustrate flipping the semiconductor structure over and removal of a portion of a substrate of the semiconductor structure, according to an exemplary embodiment.
Figure 31:
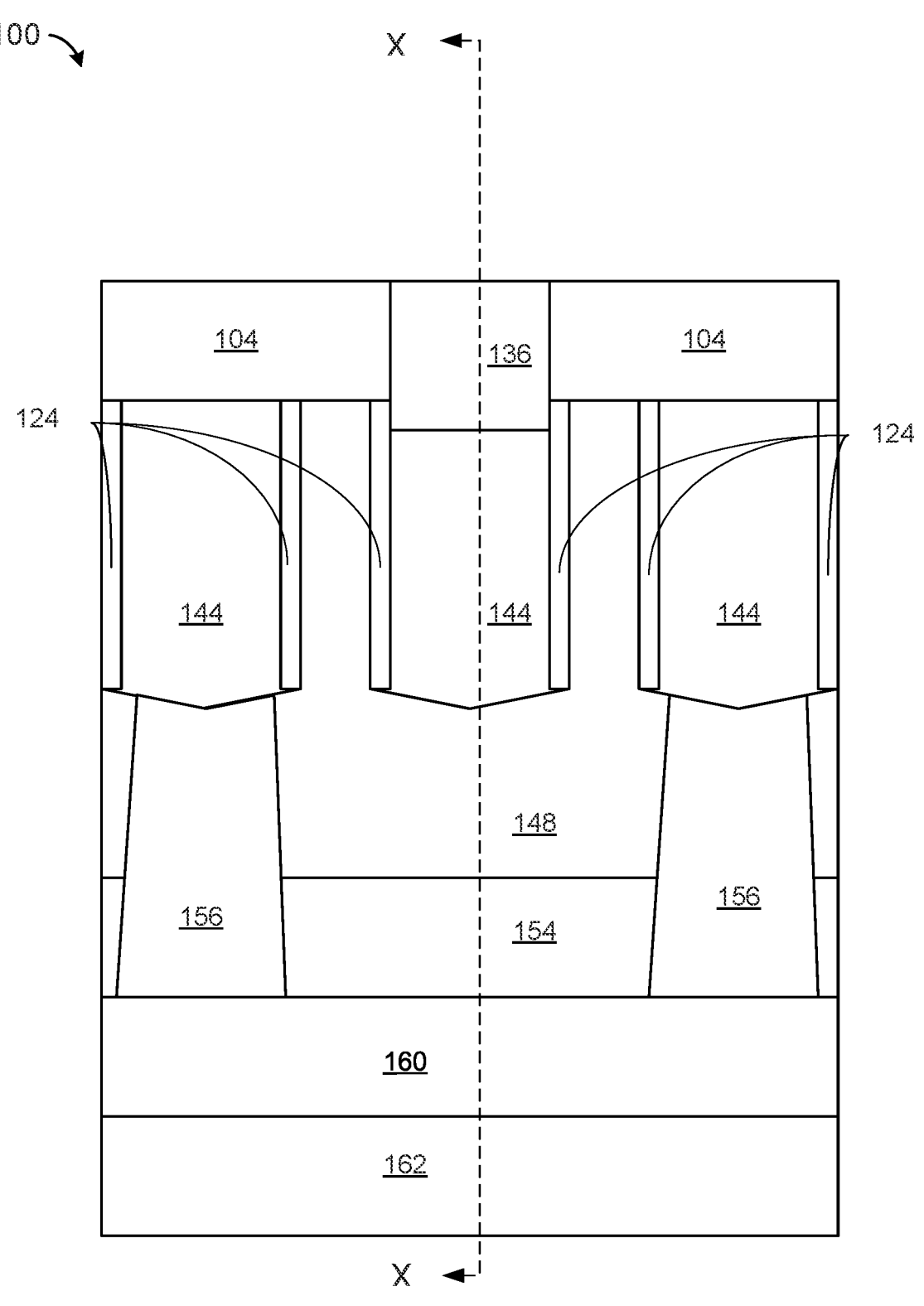

Referring now to FIGS. 30 and 31, the structure 100 is shown according to an exemplary embodiment. FIGS. 30 and 31 are each a cross-sectional view of the structure 100 along section lines X-X and Y-Y, respectively. FIGS. 30 and 31 are perpendicular to each other. The structure 100 may be flipped and the silicon substrate 102 may be removed.

The structure 100 may be turned such that the carrier wafer 162 is now at shown at the bottom of FIGS. 30 and 31, at a lowest point of the structure, and a lower surface of the silicon substrate 102 is now shown at a upper level of the structure for further processing.

The silicon substrate 102 may be selectively removed using a combination of processes steps, such as wafer grinding, CMP, RIE and wet etch process. The final stage of the process may include selectively etching any remaining silicon of the silicon substrate 102 to expose a surface of the BOX SiO2 104 and to expose the sacrificial backside contact placeholder 136.

The silicon substrate 102 may be removed and an upper horizontal surface of the structure 100 includes an upper horizontal surface of the sacrificial backside contact placeholder 136 and an upper horizontal surface of the BOX SiO2 104. There may be more than one sacrificial backside contact placeholders 136. Each of the sacrificial backside contact placeholders 136 may be adjacent to a source drain 144 which does not have an upper contact 156.

Figure 32:
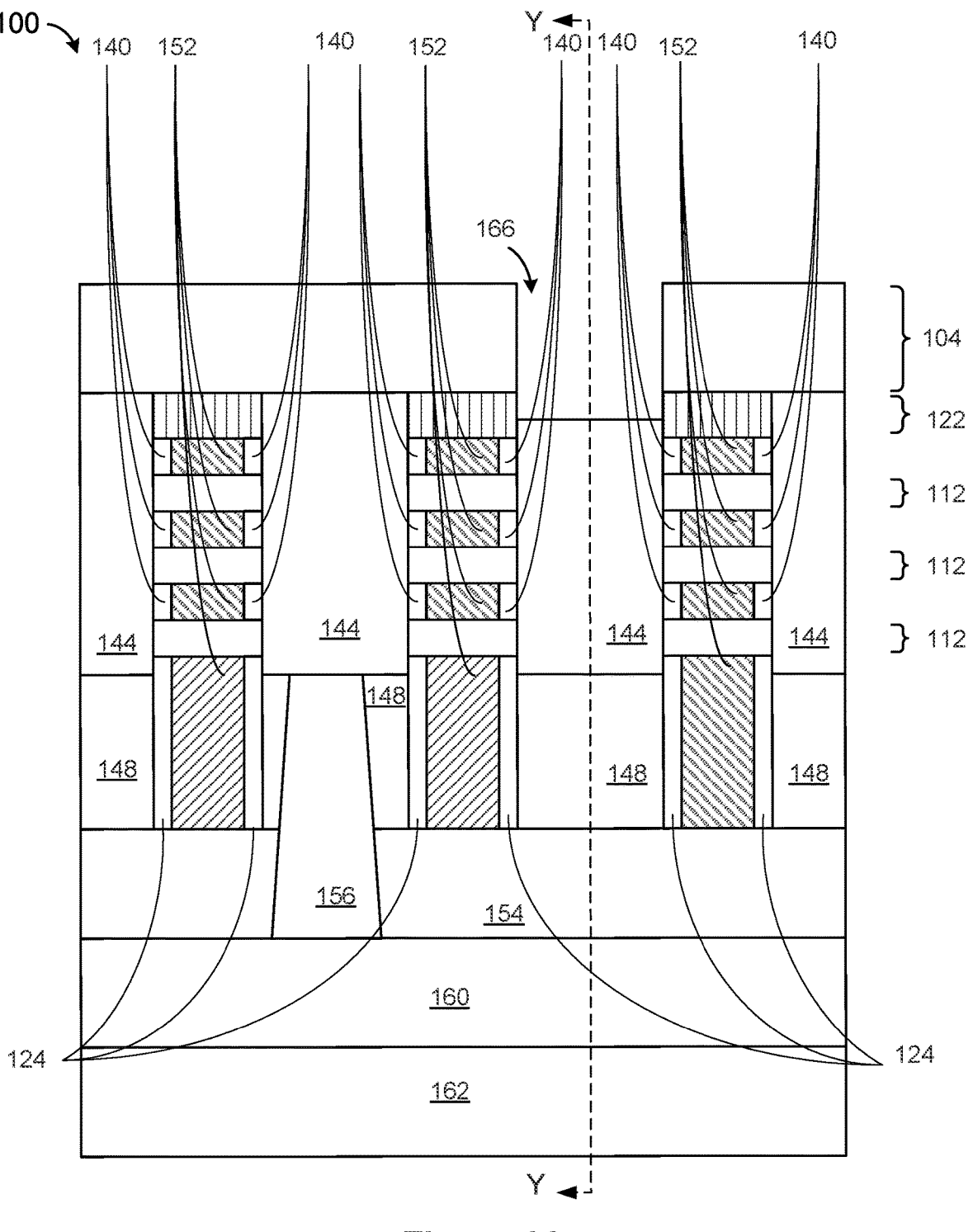
FIGS. 32 and 33 each illustrate a cross-sectional view of the semiconductor structure along section line X-X and Y-Y, respectively, and illustrate removal of the sacrificial backside contact placeholder and formation of a bottom contact opening, according to an exemplary embodiment.
Figure 33:
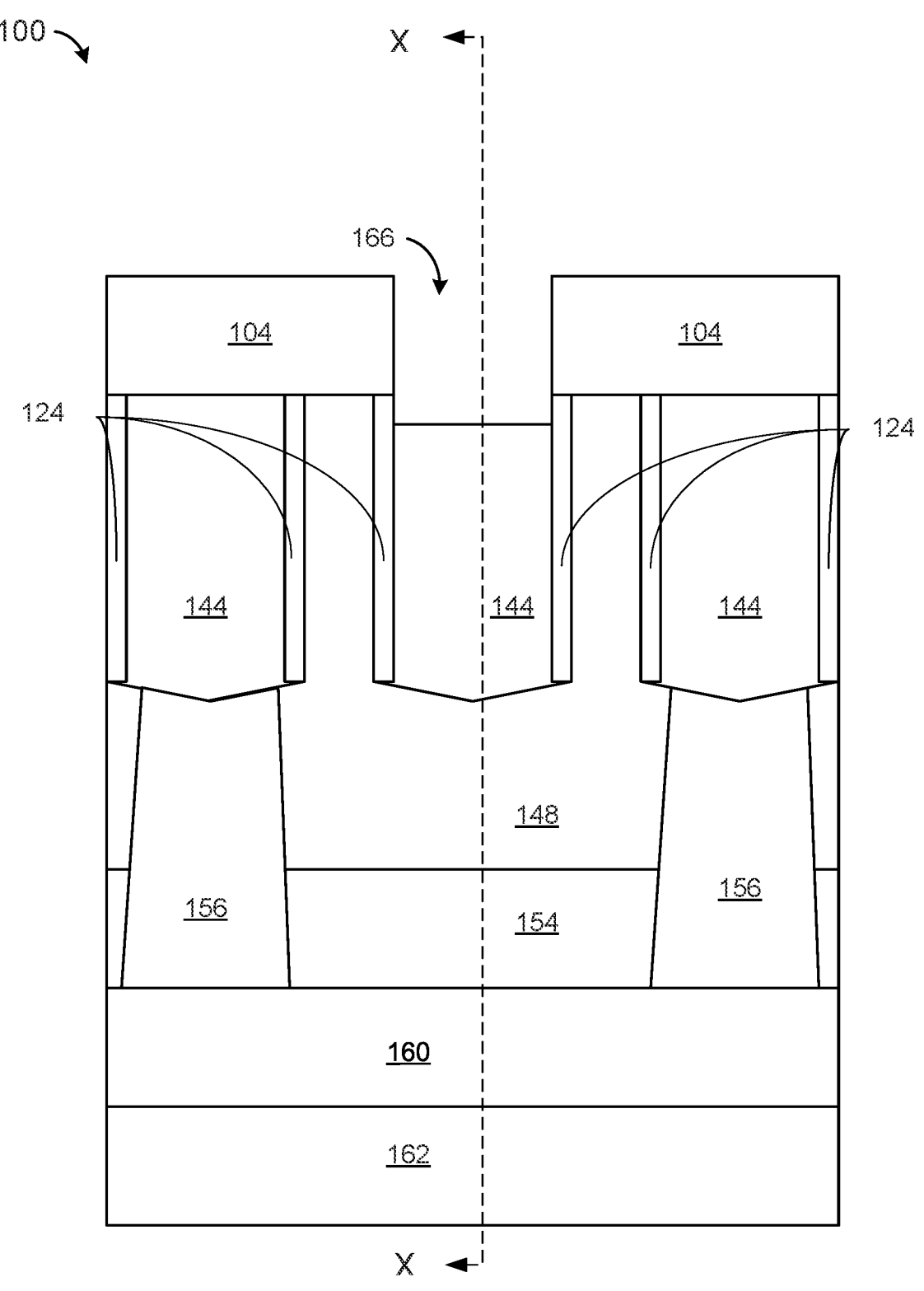

Referring now to FIGS. 32 and 33, the structure 100 is shown according to an exemplary embodiment. FIGS. 32 and 33 are each a cross-sectional view of the structure 100 along section lines X-X and Y-Y, respectively. FIGS. 32 and 33 are perpendicular to each other. The sacrificial backside contact placeholder 136 may be removed and a bottom contact opening 166 formed.

The sacrificial backside contact placeholder 136 may be selectively removed using known techniques, forming the bottom contact opening 166. For example, a wet or dry etch process can be used with the appropriate chemistry to remove the sacrificial backside contact placeholder 136. The material used for the etching process may be selective such that the BDI 122 and the box BOX SiO2 104 remain and are not etched.

Figure 34:
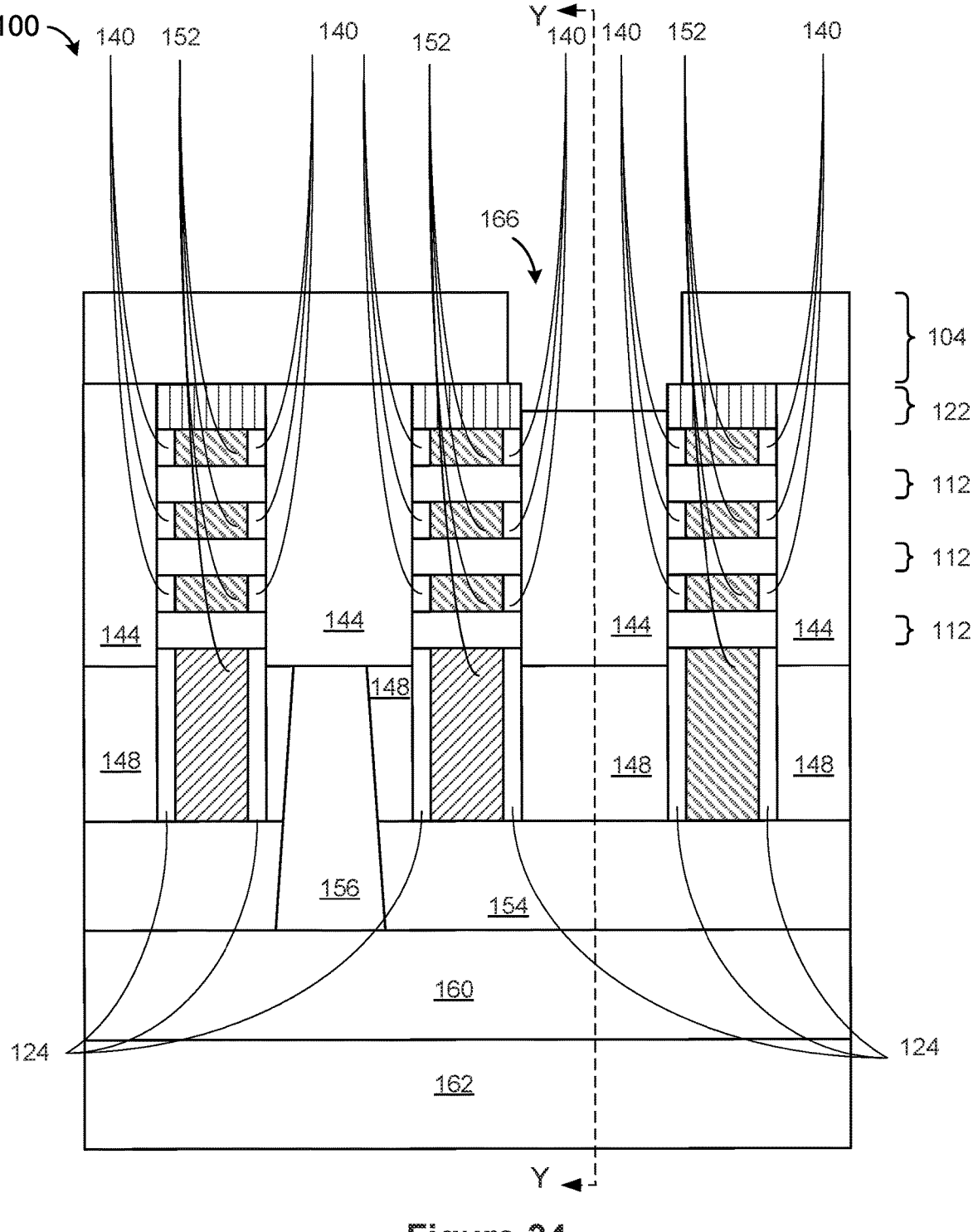
FIGS. 34 and 35 each illustrate a cross-sectional view of the semiconductor structure along section line X-X and Y-Y, respectively, and illustrate a pre-epitaxy clean, according to an exemplary embodiment.
Figure 35:
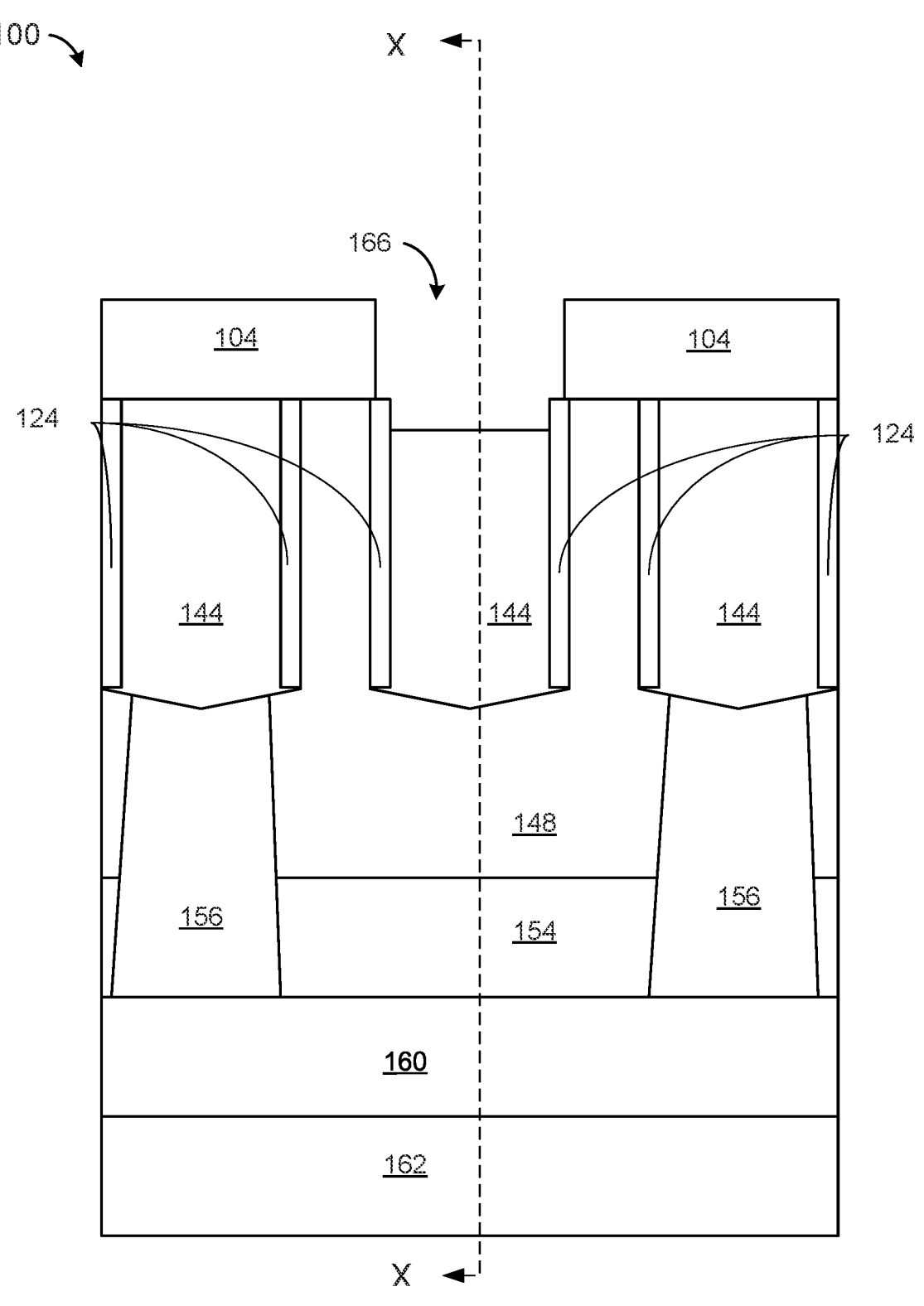

Referring now to FIGS. 34 and 35, the structure 100 is shown according to an exemplary embodiment. FIGS. 34 and 35 are each a cross-sectional view of the structure 100 along section lines X-X and Y-Y, respectively. FIGS. 34 and 35 are perpendicular to each other. A contact opening enlargement clean may be performed.

The contact opening enlargement clean may be done which may enlarged a size of the bottom contact opening 166 and remove any native oxide over the source drain 144, and during this process, a horizontal portion of the BOX SiO2 104 and a vertical portion of the BOX SiO2 104 may being etched, increasing the size of the bottom contact opening 166. An example of a contact opening enlargement clean may include a DHF wet clean or SiCoNi dry clean process. Siconi is a trademark of Applied Materials, Inc.

The contact opening enlargement clean may expose a portion of an upper surface of the BDI 122. The contact opening enlargement clean may expose a portion of an upper surface and a portion of a vertical surface of a pair of dielectric spacers 124 surrounding the bottom contact opening 166. While the bottom contact opening 166 is enlarged, the high-k metal gate 152 is isolated from the bottom contact opening 166 due to the BDI 122. The enlarged bottom contact opening 166 is beneficial for forming a larger silicide and metal plug volume helping to lower contact resistance of a subsequently formed contact in the bottom contact opening 166.

Figure 36:
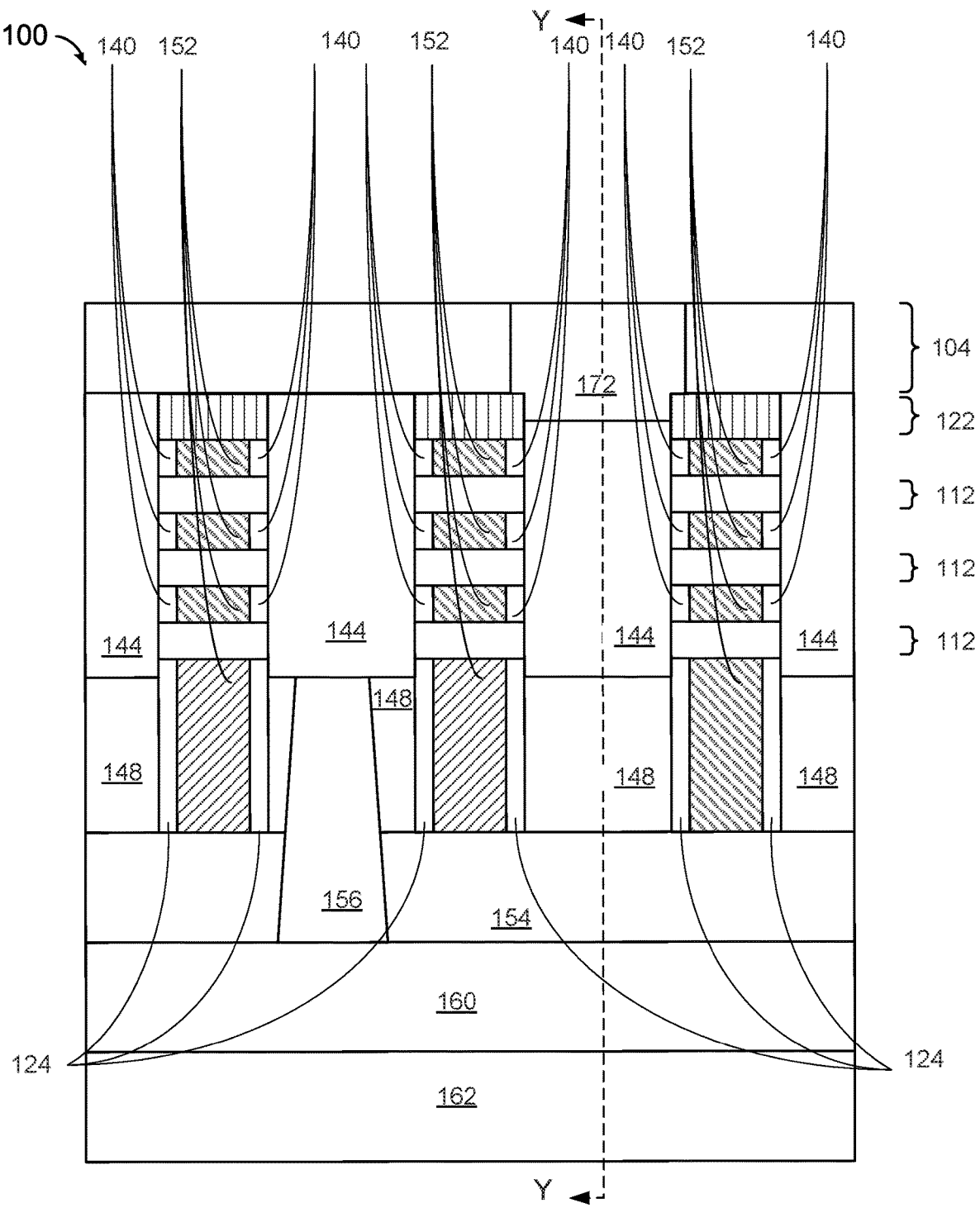
FIGS. 36 and 37 each illustrate a cross-sectional view of the semiconductor structure along section line X-X and Y-Y, respectively, and illustrate forming a bottom contact, according to an exemplary embodiment.
Figure 37:
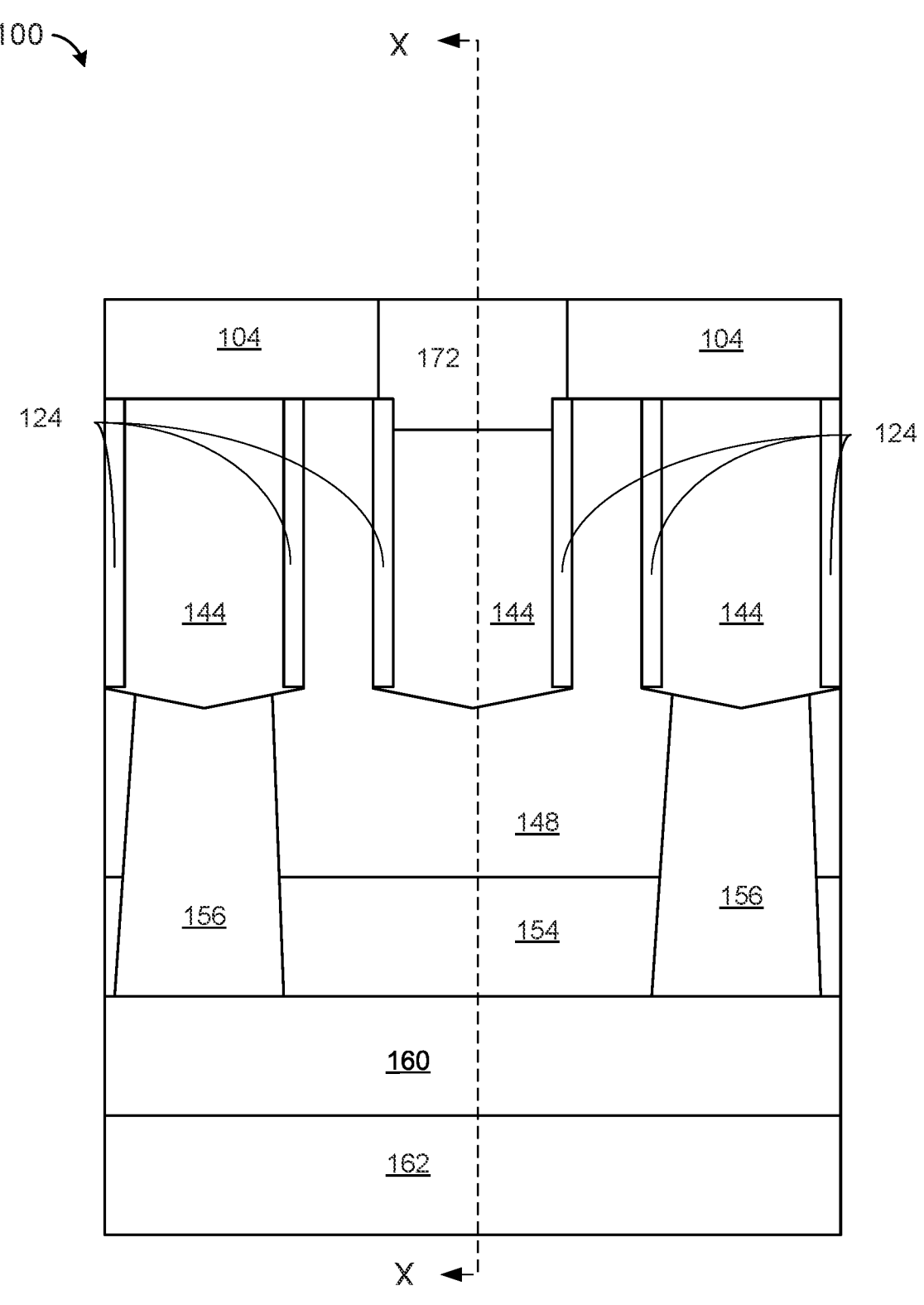

Referring now to FIGS. 36 and 37, the structure 100 is shown according to an exemplary embodiment. FIGS. 36 and 37 are each a cross-sectional view of the structure 100 along section lines X-X and Y-Y, respectively. FIGS. 36 and 37 are perpendicular to each other. A bottom contact 172 may be formed.

The bottom contact 172 may be formed in the bottom contact opening 166 to form a contact to the source drain 144. As shown in FIGS. 36 and 37, there is one bottom contact 172. There may be any number of bottom contacts 172 on the structure 100.

Forming the bottom contact 172 involves filling the bottom contact opening 166 with highly-conductive metallic materials. Individual metallic materials within the bottom contact 172 are not shown for clarity. While the bulk of the bottom contact 172 includes an elemental metal such as Co, Ru, or Mo to reduce its bulk resistivity, the metallic compound directly adjacent to the semiconductor of the source drain 144 is selected to reduce the contact resistance between the bottom contact 172 and the semiconductor of the source drain 144. In one embodiment, the metallic compound adjacent to the semiconductor of the source drain 144 is a metal silicide or germanosilicide. This compound can be created by reacting an elemental metal such as titanium with the semiconductor of the source drain 144. While metal silicide/germanosilicide is made thin, typically less than 3 nm, it sets the Schottky barrier of the semiconductor-metal interface and, ultimately, the contact resistivity of the interface. The metal silicide/germanosilicide may be separated from the elemental metal fill of the bottom contact 172 by a thin conductive metallic liner such as Titanium Nitride liner. High concentration of free carriers in the semiconductor of the source drain 144 and a low Schottky barrier between the metal silicide/germanoslicide and the semiconductor of the source drain 144 allows for a low contact resistivity of about $10^{-9}$ W·cm$^2$ for the backside contact structure to both n-type and p-type semiconductors. Presence of multiple metallic compounds within the bottom contact 172 does not affect much its series resistance because additional interfacial compounds and liners are made thin in comparison to the elemental metal fill and each metal-metal interfacial resistance is at least an order of magnitude lower than that of semiconductor-metal interface.

A contact resistivity of the source drain 144 to the adjacent metallic compound of the bottom contact 172 may be equal to or less then 1e-9 Ohm cm$^2$. A volume concentration of free electrical carriers (electrons or holes) of the source drain 144 may be equal to or more than 7e20 cm$^{-3}$.

In comparison, a contact resistively of the source drain 144 to the contact 156 may be greater than or equal to 2e-9 Ohm cm$^2$. A volume concentration of free electrical carriers (electrons or holes) of the source drain 144 may be less than or equal to 5e20 cm$^{-3}$.

The bottom contact 172 may be made to the source drain 144 which does not have an upper contact 156. The source drain 144 may have either an upper contact 156 or a bottom contact 172. This provides more options for a source drain contact. In an example, a source drain 144 of an n-FET nanosheet stack may each have an upper contact 156 and a source drain 144 of a p-FET nanosheet stack may each have a bottom contact 172. The alternative is also an embodiment.

A chemical mechanical polishing (CMP) technique may be used to remove excess material and polish upper surfaces of the structure 100. An upper surface of the structure 100 may include an upper horizontal surface of the BOX SiO2 104 and an upper horizontal surface of the bottom contact 172.

Figure 38:
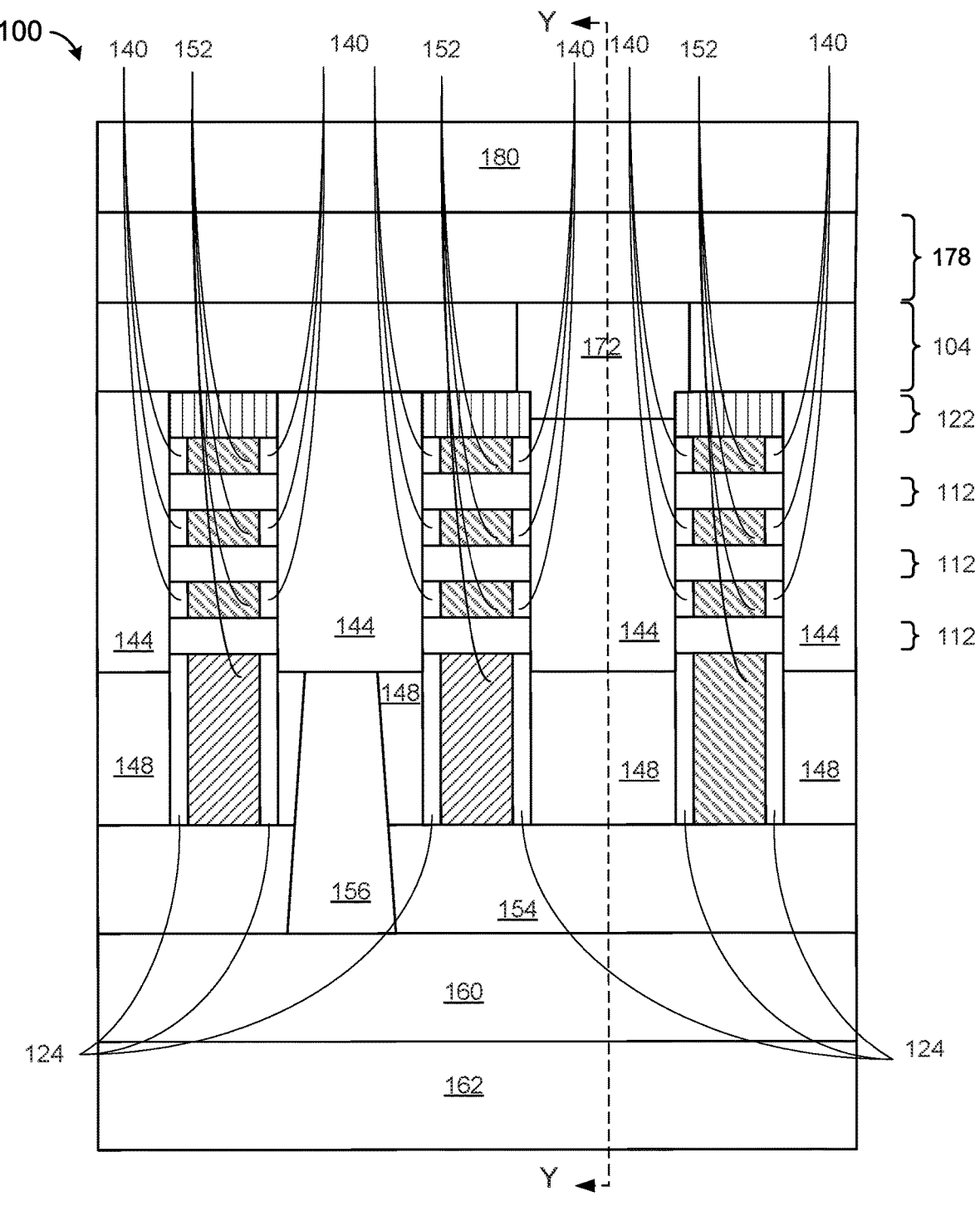
FIGS. 38 and 39 each illustrate a cross-sectional view of the semiconductor structure along section line X-X and Y-Y, respectively, and illustrate forming an inter-layer dielectric, a backside power rail and a backside power delivery network, according to an exemplary embodiment.
Figure 39:
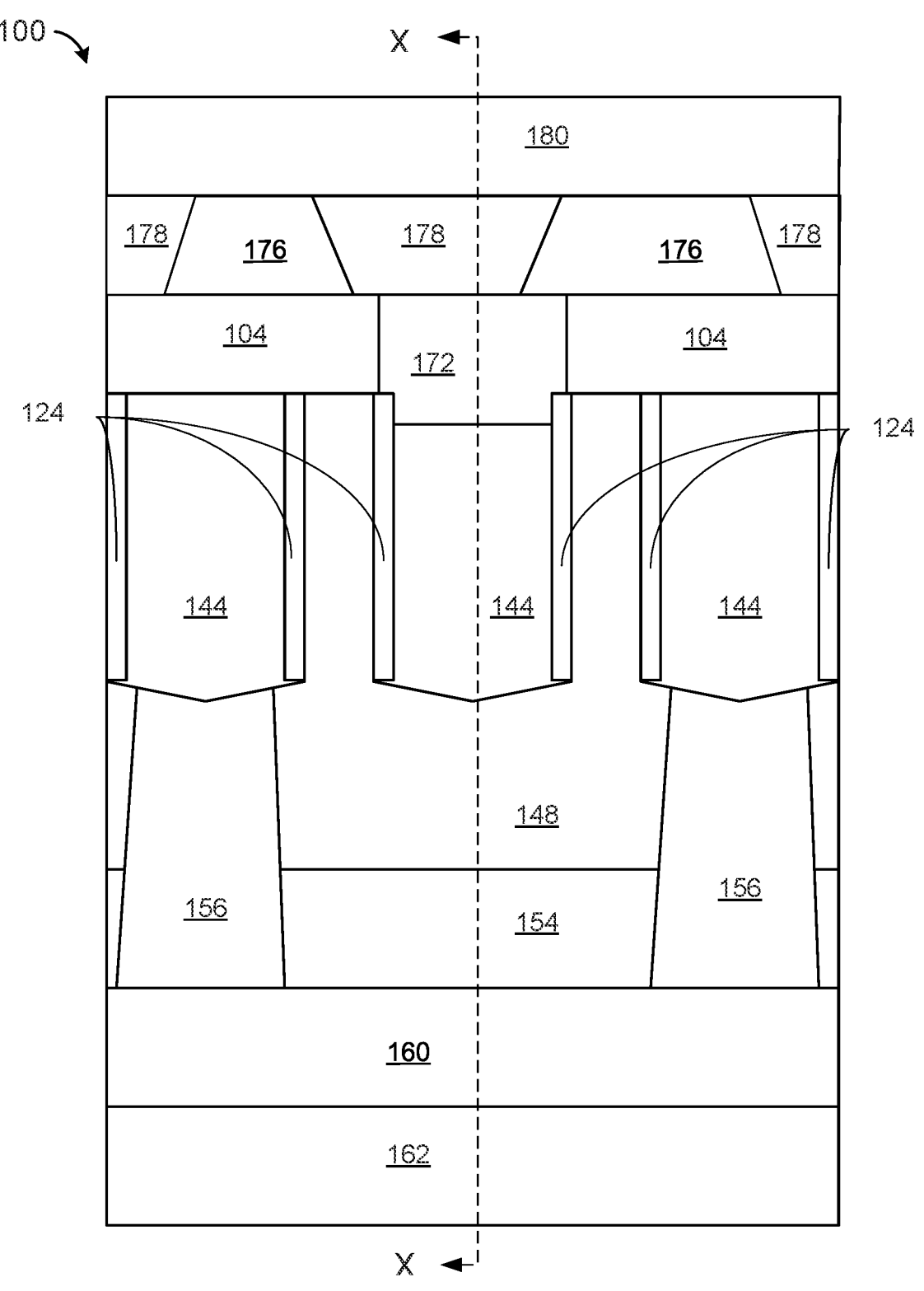

Referring now to FIGS. 38 and 39, the structure 100 is shown according to an exemplary embodiment. FIGS. 38 and 39 are each a cross-sectional view of the structure 100 along section lines X-X and Y-Y, respectively. FIGS. 38 and 39 are perpendicular to each other. An inter-layer dielectric (hereinafter "ILD") 176 may be formed. A backside power rail (hereinafter "BPR") 178 and a backside power delivery network (hereinafter "BSPDN") 180 may be formed.

The ILD 176 may be formed by conformally depositing or growing a dielectric material, as described for the ILD 148. A lower surface of the ILD 148 may be adjacent to the upper horizontal surface of the BOX SiO2 104 and the upper horizontal surface of the bottom contact 172.

The BPR 178 may be formed in openings (not shown) in the ILD 176 using known techniques. In an embodiment, the BPR 178 may be parallel to section line X-X and perpendicular to section line Y-Y. A lower horizontal surface of the BPR 178 may be adjacent to an upper horizontal surface of the bottom contact 172. As shown in FIG. 39, there are three BPRs 178, however there may be any number of BPRs 178 in the structure 100.

The BSPDN 180 may be formed on the ILD 176 and on the BPR 178. The BSPDN 180 may include additional layers of wiring and vias formed above the existing structure, above the ILD 176 and on the BPR 178. In an embodiment, the BSPDN 180 may include 3 or more layers of lines and visas. The BSPDN 180 may be formed using known techniques.

The resulting structure 100 includes an FET nanosheet with a self-aligned backside contact, the bottom contact 172, providing a contact with enlarged size, without shorting to high-k metal gate 152, providing additional options for forming a bottom contact 172 to the FET nanosheet on a backside of the structure.

Figure 40:
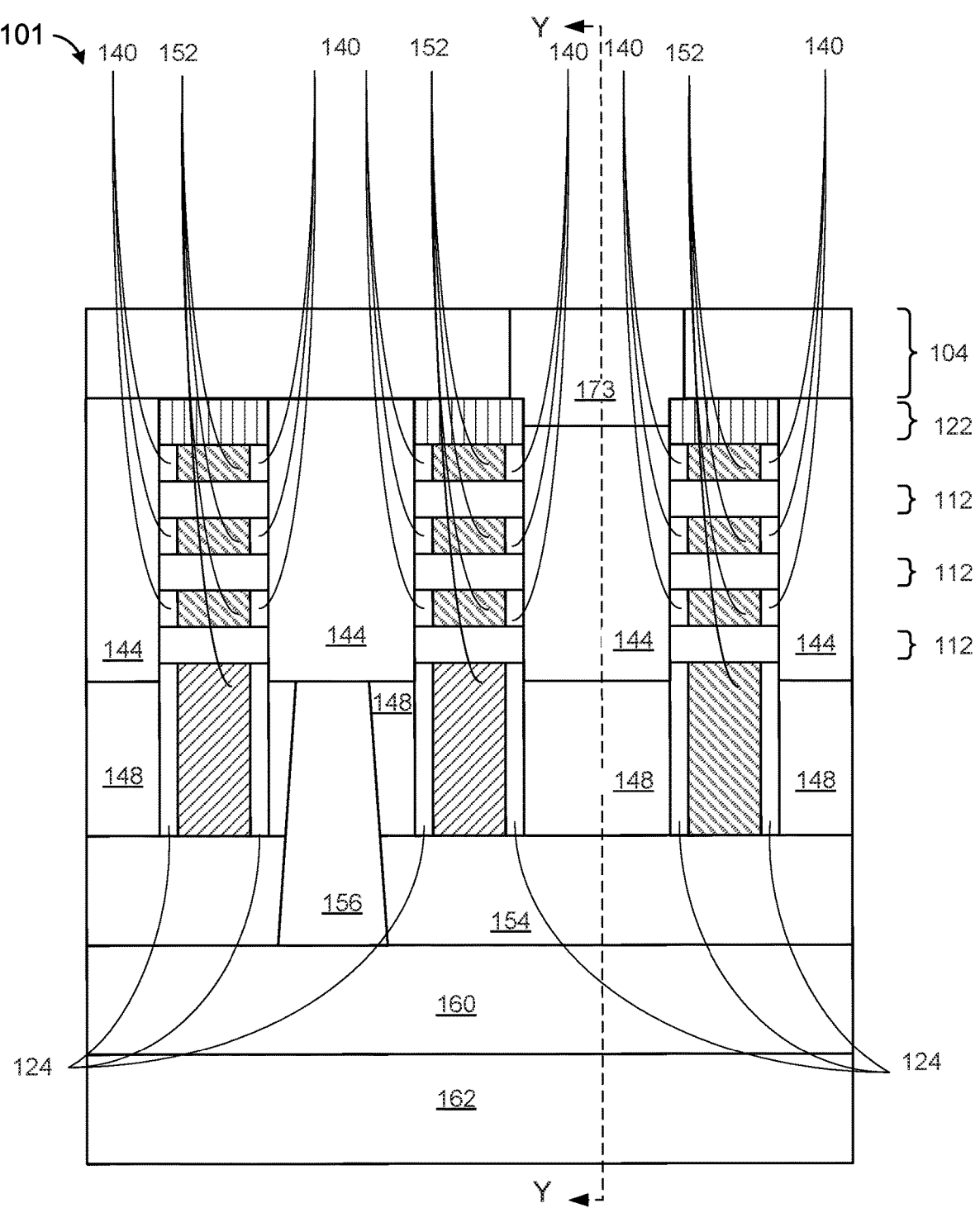
FIGS. 40 and 41 each illustrate a cross-sectional view of an alternate semiconductor structure along section line X-X and Y-Y, respectively, and illustrate forming a bottom contact, according to an exemplary embodiment.
Figure 41:
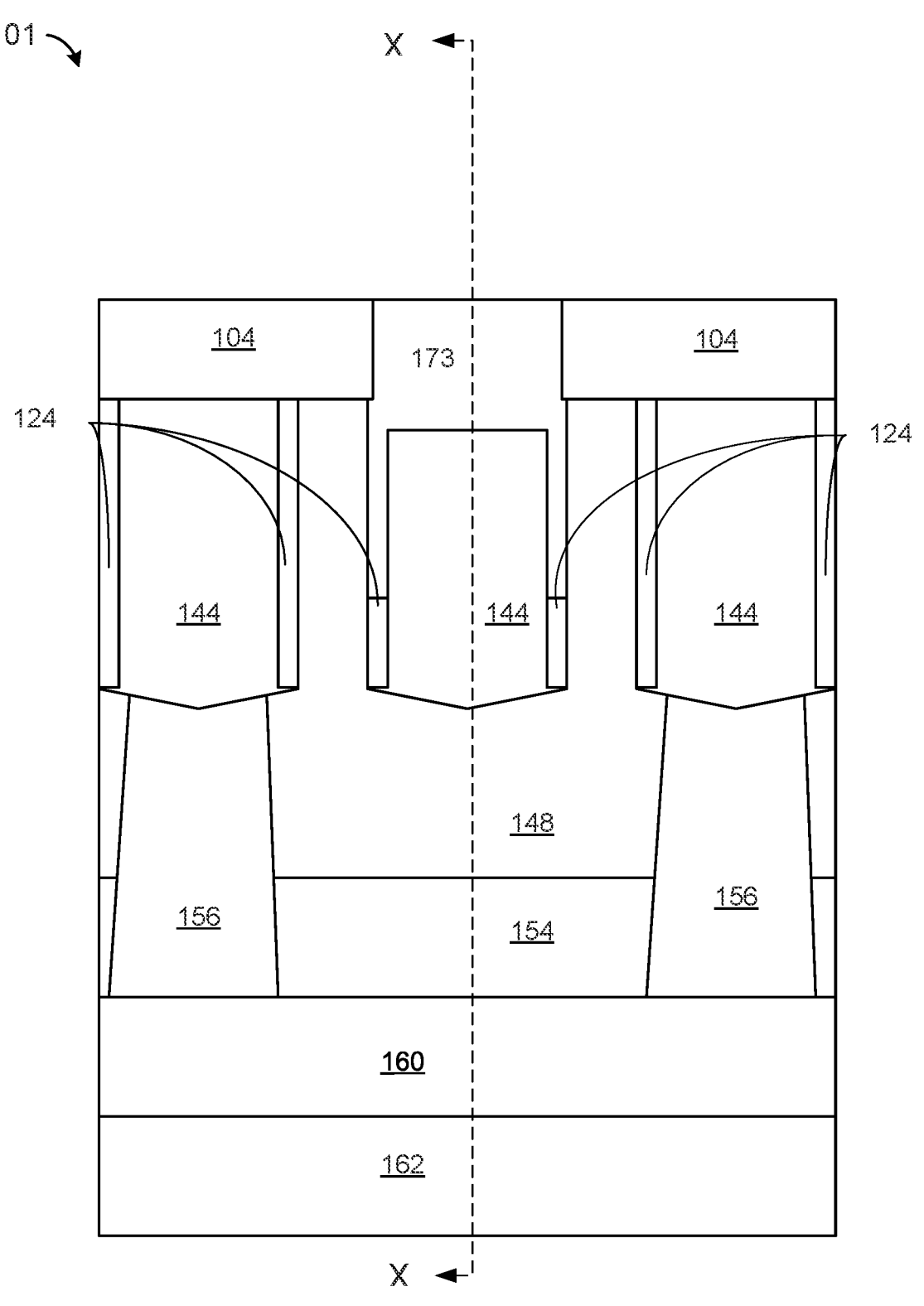

Referring now to FIGS. 40 and 41, a structure 101 is shown according to an exemplary embodiment. FIGS. 40 and 41 are each a cross-sectional view of the structure 101 along section lines X-X and Y-Y, respectively. FIGS. 40 and 41 are perpendicular to each other. The structure 101 is an alternate embodiment of the structure 100. The structure 101 may be formed as described for the structure 100 and is an alternative embodiment depicting processing steps subsequent to those shown in FIGS. 34 and 35. All portions with similar names may be formed as described for FIGS. 1-39.

The opening 166 as shown in FIGS. 34 and 35 may be increased by selective removal of portions of the dielectric spacer 124 surrounding the source drain 144 of the opening 166. In this embodiment, the dielectric spacer 124 is a different material than the BDI 122 and may be selectively etched. In an embodiment the dielectric spacer 124 may include SiN, SiBCN, or SiOCN, and the BDI may include SiC.

A bottom contact 173 may be formed in the opening 166, which now has an increased volume. The bottom contact 173 may surround portions of side surfaces of the source drain 144.

The bottom contact 173 may be formed in the bottom contact opening 166 to form a contact to the source drain 144. As shown in FIGS. 40 and 41, there is one bottom contact 173. There may be any number of bottom contacts 173 on the structure 101.

The bottom contact 173 may be made to the source drain 144 which does not have an upper contact 156. The source drain 144 may have either an upper contact 156 or a bottom contact 173. This provides more options for a source drain contact. In an example, a source drain 144 of an n-FET nanosheet stack may each have an upper contact 156 and a source drain 144 of a p-FET nanosheet stack may each have a bottom contact 173. The alternative is also an embodiment.

A chemical mechanical polishing (CMP) technique may be used to remove excess material and polish upper surfaces of the structure 101. An upper surface of the structure 101 may include an upper horizontal surface of the BOX SiO2 104 and an upper horizontal surface of the bottom contact 173.

Figure 42:
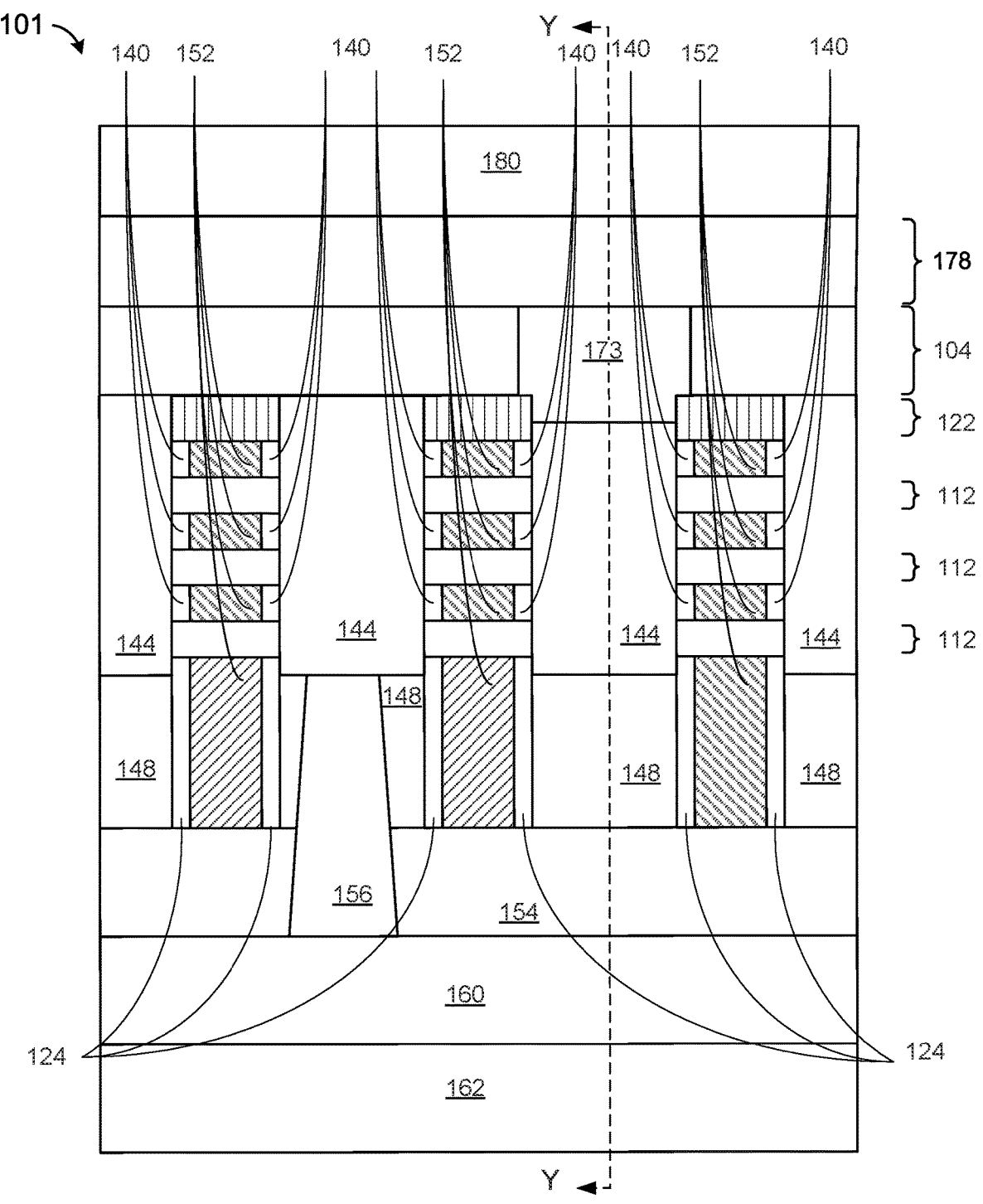
FIGS. 42 and 43 each illustrate a cross-sectional view of the alternate semiconductor structure along section line X-X and Y-Y, respectively, and illustrate forming an inter-layer dielectric, a backside power rail and a backside power delivery network, according to an exemplary embodiment.
Figure 43:
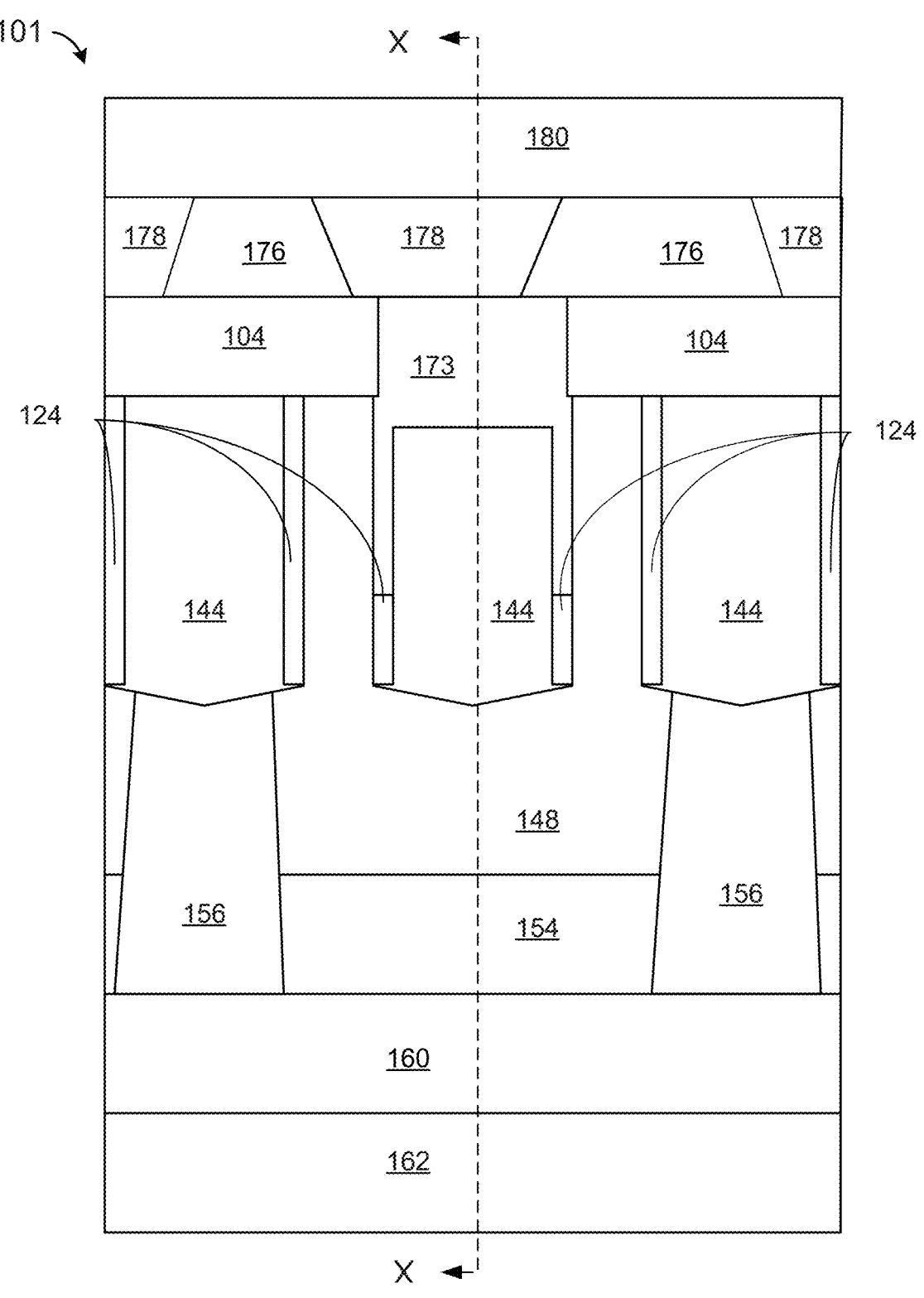

Referring now to FIGS. 42 and 43, the structure 101 is shown according to an exemplary embodiment. FIGS. 42 and 43 are each a cross-sectional view of the structure 101 along section lines X-X and Y-Y, respectively. FIGS. 42 and 43 are perpendicular to each other. An inter-layer dielectric (hereinafter "ILD") 176 may be formed. A backside power rail (hereinafter "BPR") 178 and a backside power delivery network (hereinafter "BSPDN") 180 may be formed.

The ILD 176 may be formed by conformally depositing or growing a dielectric material, as described for the ILD 148. A lower surface of the ILD 148 may be adjacent to the upper horizontal surface of the BOX SiO2 104 and the upper horizontal surface of the bottom contact 173.

The BPR 178 may be formed in openings (not shown) in the ILD 176 using known techniques. In an embodiment, the BPR 178 may be parallel to section line X-X and perpendicular to section line Y-Y. A lower horizontal surface of the BPR 178 may be adjacent to an upper horizontal surface of the bottom contact 173. As shown in FIG. 43, there are three BPRs 178, however there may be any number of BPRs 178 in the structure 100.

The BSPDN 180 may be formed on the ILD 176 and on the BPR 178. The BSPDN 180 may include additional layers of wiring and vias formed above the existing structure, above the ILD 176 and on the BPR 178. In an embodiment, the BSPDN 180 may include 3 or more layers of lines and visas. The BSPDN 180 may be formed using known techniques.

The resulting structure 101 includes an FET nanosheet with a self-aligned backside contact, the contact 173, providing a contact with an enlarged size compared to the contact 172 of FIG. 100. The contact 172 is formed by extending into an area where portions of the dielectric spacer 124 surrounding the source drain 144 were removed, to form a wrap-around-contact surrounding the source drain 144, which does not have a short to the high-k metal gate 15. This provides additional options for forming a contact to the FET nanosheet on the backside of the structure.

An advantage of the structure 101 compared to the structure 100 is the bottom contact 173 has a greater surface area contact to the source drain 144 in the structure 101 than the bottom contact 172 in the structure 100. This has an advantage of reducing a contact resistance at a given contact resistivity of materials used.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A semiconductor device comprising:
   a first source drain;
   a frontside contact structure below and directly contacting the first source drain;
   a second source drain, wherein both the first source drain and the second source drain are in a same horizontal plane;
   first sidewall spacers arranged on opposite sidewalls of the second source drain; and
   a backside contact structure above and directly contacting the second source drain,
   wherein inner sidewalls of the backside contact structure directly contact the opposite sidewalls of the second source drain, and
   wherein top surfaces of the first sidewall spacers directly contact bottommost surfaces of the backside contact structure.

2. The semiconductor device according to claim 1, wherein a width of the backside contact structure is greater than a width of the second source drain measured in a horizontal direction perpendicular to a gate length.

3. The semiconductor device according to claim 1, wherein the bottommost surfaces of the backside contact structure are below a topmost surface of the second source drain.

4. The semiconductor device according to claim 1, wherein a width of a first portion of the backside contact structure measured from one sidewall of the inner sidewalls in a horizontal direction perpendicular to a gate length is equal to a width of one sidewall spacer of the first sidewall spacers measured from the one sidewall of the inner sidewalls in the horizontal direction perpendicular to the gate length.

5. The semiconductor device according to claim 1, further comprising:
   a bottom dielectric isolation layer between and physically separating the backside contact structure from a gate structure, wherein a top surface of the first source drain is substantially flush with a topmost surface of the bottom dielectric isolation layer, and wherein a top surface of the second source drain is below the topmost surface of the bottom dielectric isolation layer.

6. The semiconductor device according to claim 1, further comprising:

second sidewall spacers arranged on opposite sidewalls of the first source drain, wherein bottommost surfaces of the second sidewall spacers are substantially flush with bottommost surfaces of the first sidewall spacers, wherein a height of the first sidewall spacers is less than a height of the second sidewall spacers.

7. The semiconductor device according to claim 1, further comprising:

a bottom dielectric isolation layer between and physically separating the backside contact structure from a gate structure, wherein the first sidewall spacers and the bottom dielectric isolation layer are made from a same material, and wherein the backside contact structure directly contacts both a top and a side of the bottom dielectric isolation layer.

8. A semiconductor device comprising:

a frontside contact structure directly below and electrically connected to a first source drain;

a backside contact structure directly above and electrically connected to a second source drain, wherein both the first source drain and the second source drain are in a same horizontal plane; and first sidewall spacers arranged on opposite sidewalls of the second source drain;

wherein a topmost surface of the second source drain is below a topmost surface of the first source drain.

9. The semiconductor device according to claim 8, wherein a width of the backside contact structure is greater than a width of the second source drain measured in a a horizontal direction perpendicular to a gate length.

10. The semiconductor device according to claim 8, wherein bottommost surfaces of the backside contact structure are below the topmost surface of the second source drain.

11. The semiconductor device according to claim 8, wherein a width of a first portion of the backside contact structure measured in a horizontal direction perpendicular to a gate length is equal to a width of one sidewall spacer of the first sidewall spacers measured in the horizontal direction perpendicular to the gate length.

12. The semiconductor device according to claim 8, wherein top surfaces of the first sidewall spacers directly contact bottom surfaces of the backside contact structure.

13. The semiconductor device according to claim 8, further comprising:

second sidewall spacers arranged on opposite sidewalls of the first source drain, wherein bottommost surfaces of the second sidewall spacers are substantially flush with bottommost surfaces of the first sidewall spacers, wherein a height of the first sidewall spacers is less than a height of the second sidewall spacers.

14. The semiconductor device according to claim 8, further comprising:

a bottom dielectric isolation layer between and physically separating the backside contact structure from a gate structure, wherein the first sidewall spacers and the bottom dielectric isolation layer are made from a same material, and wherein the backside contact structure directly contacts both a top and a side of the bottom dielectric isolation layer.

15. A semiconductor device comprising:

a source drain;

sidewall spacers arranged on opposite sidewalls of the source drain; and a backside contact structure above and directly contacting the source drain, wherein inner sidewalls of the backside contact structure directly contact the opposite sidewalls of the source drain, and wherein top surfaces of the sidewall spacers directly contact bottommost surfaces of the backside contact structure.

16. The semiconductor device according to claim 15, wherein a width of the backside contact structure is greater than a width of the source drain measured in a a horizontal direction perpendicular to a gate length.

17. The semiconductor device according to claim 15, wherein the bottommost surfaces of the backside contact structure are below a topmost surface of the source drain.

18. The semiconductor device according to claim 15, wherein a width of a first portion of the backside contact structure measured from one sidewall of the inner sidewalls in a horizontal direction perpendicular to a gate length is equal to a width of one sidewall spacer of the sidewall spacers measured from the one sidewall of the inner sidewalls in the horizontal direction perpendicular to the gate length.

19. The semiconductor device according to claim 15, further comprising:

a bottom dielectric isolation layer between and physically separating the backside contact structure from a gate structure, wherein a top of the source drain is below a topmost surface of the bottom dielectric isolation layer and above a bottommost surface of the bottom dielectric isolation layer.

20. The semiconductor device according to claim 15, further comprising:

a bottom dielectric isolation layer between and physically separating the backside contact structure from a gate structure, wherein the sidewall spacers and the bottom dielectric isolation layer are made from a same material, and wherein the backside contact structure directly contacts both a top and a side of the bottom dielectric isolation layer.

* * * * *